(12) United States Patent
Ioppolo et al.

(10) Patent No.: US 8,718,416 B2
(45) Date of Patent: May 6, 2014

(54) MICRO-OPTICAL SENSOR FOR ELECTRIC FIELD DETECTION

(75) Inventors: Tindaro Ioppolo, Dallas, TX (US); Volkan Otugen, Dallas, TX (US); Ulas Ayaz, Dallas, TX (US)

(73) Assignee: Southern Methodist University, Dallas, TX (US)

( * ) Notice: Subject to any disclaimer, the term of this patent is extended or adjusted under 35 U.S.C. 154(b) by 572 days.

(21) Appl. No.: 12/939,168

(22) Filed: Nov. 3, 2010

(65) Prior Publication Data

US 2011/0277540 A1 Nov. 17, 2011

Related U.S. Application Data

(60) Provisional application No. 61/257,663, filed on Nov. 3, 2009.

(51) Int. Cl.
*G02B 6/00* (2006.01)

(52) U.S. Cl.
USPC .............................. 385/12; 385/13; 385/147

(58) Field of Classification Search
USPC ............................................. 385/12, 13, 147
See application file for complete search history.

(56) References Cited

U.S. PATENT DOCUMENTS

| | | | | |
|---|---|---|---|---|
| 5,404,064 | A * | 4/1995 | Mermelstein et al. | 310/319 |
| 6,922,059 | B2 | 7/2005 | Zank et al. | |
| 2007/0139654 | A1 * | 6/2007 | Matsumoto et al. | 356/445 |
| 2008/0238433 | A1 | 10/2008 | Joutsenoja et al. | |
| 2009/0091329 | A1 | 4/2009 | Barsukov et al. | |

OTHER PUBLICATIONS

Arnold, S., et al., "Shift of Whispering-Gallery Modes in Microspheres by Protein Adsorption," Feb. 15, 2003, vol. 28, No. 4, pp. 272-274.
Ay, Feridun, et al., "Prism Coupling Technique Investigation of Elasto-Optical Properties of Thin Polymer Films," Journal of Applied Physics, Dec. 15, 2004, vol. 96, No. 12, pp. 7147-7153.
Ayaz, UK, et al., "Wall Shear Stress Sensor Based on the Optical Resonances of Dielectric Microspheres," Measurement Science and Technology, (2011), 22, 10 pages.
Cai, M., et al., "Fiver-Coupled Microsphere Laser," Optics Letters, Oct. 1, 2000, vol. 25, No. 19, pp. 1430-1432.
Das, Nirod, et al., "Investigation of a Micro-Optical Species Concentration Sensor Concept Based on Whispering galley Mode Resonators," presented at the 45th AIAA Aerospace Sciences Meeting and Exhibition, Reno, Nevada, Jan. 8-11, 2007, 11 pages.

(Continued)

*Primary Examiner* — Charlie Peng
*Assistant Examiner* — Mary El Shammaa
(74) *Attorney, Agent, or Firm* — Daniel J. Chalker; Edwin S. Flores; Chalker Flores, LLP

(57) ABSTRACT

A novel micro-optical electric field sensor exploits morphology-dependent shifts of the optical modes of dielectric cavities to measure temporally- and spatially-resolved of electric field with extremely high sensitivity. The measurement principle is based on the electrostriction effect on the optical modes of dielectric micro-resonators (or micro-cavities) and exploits recent developments in optical fiber and switching technologies. The optical modes are commonly referred to as "whispering gallery modes" (WGM) or "morphology dependent resonances" (MDR). By monitoring the WGM shifts, the electric field causing the electrostriction effect can be determined. Different sensitivities and measurement ranges (maximum measured electric field) can be obtained by using different cavity geometries (for example solid or hollow spheres), polymeric materials (PMMA, PDMS, etc) as well as poling the dielectric material.

33 Claims, 6 Drawing Sheets

(56) References Cited

OTHER PUBLICATIONS

Guan, G., et al., "Temperature Measurements Using a Microoptical Sensor Based on Whispering Gallery Modes," AIAA Journal, Oct. 2006, vol. 44, No. 10, pp. 2385-2389.

Ilchenko, V.S., et al., "Strain-Tunable High-Q Optical Microsphere Resonator," Optics Communications, (1998), vol. 145, pp. 86-90.

Ioppolo, Tindaro, et al., "Pressure Tuning of Whispering Gallery Mode Resonators,:" J. Opt. Soc. Am. B., Oct. 2007, vol. 24, No. 10, pp. 2721-2726.

Ioppolo, Tindaro, et al., "A Micro-Optical Wall Shear Stress Sensor Concept Based on Whispering Gallery Mode Resonators," Aerospace Sciences Meeting and Exhibit, Jan. 2008, Reno, Nevada, 11 pages.

Ioppolo, T., et al., "High-Resolution Force Sensor Based on Morphology Dependent Optical Resonances of Polymeric Spheres," Journal of Applied Physics, (2009), vol. 105, 9 pages.

Ioppolo, Tindaro, et al., "Whispering Gallery Modes of Microspheres in the Presence of a Changing Surrounding Medium: A New Ray-Tracing Analysis and Sensor Experiment," Journal of Applied Physics, (2010), vol. 107, 8 pages.

Little, B.E., et al., "Microring Resonator Channel Dropping Filters," Journal of Lightwave Technology, Jun. 1997, vol. 15, No. 6, pp. 998-1005.

Offrein, B.J., et al., "Resonant Coupler-Based Tunable Add-After-Drop Filter in Silicon-Oxynitride Technology for WDM Networks," IEEE Journal of Selected Topics in Quantum Electronics, Sep./Oct. 1999, vol. 5, No. 5, pp. 1400-1406.

Passaro, Vittorio, M.N., et al., "Modeling and Design of a Novel High-Sensitivity Electric Field Silicon-on-Insulator Sensor Based on a Whispering-Gallery-Mode Resonator," IEEE Journal of Selected Topics in Quantum Electronics, Jan./Feb. 2006, vol. 12, No. 1, pp. 124-133.

Rosenberger, A.T., et al., "Whispering-Gallery-Mode Evanescent-Wave Microsensor for Trace-Gas Detection," Proc. SPIE, (2001), 4265, pp. 102-112.

Tapalian, H.C., et al., "Thermooptical Switches Using Coated Microsphere Resonators," IEEE Photonics Technology Letters, Aug. 2002, vol. 14, No. 8, pp. 1118-1120.

Vollmer, F., et al., "Protein Detection by Optical Shift of a Resonant Microcavity," Applied Physics Letters, May 27, 2002, vol. 89, No. 21, pp. 4057-4059.

Von Kvlitzing, Wolf, et al., "Tunable Whispering Gallery Modes for Spectroscopy and CQED Experiments," New J. Phys., (2001), 3, 16 pages.

Yamwong, T., et al., "Electrostrictive Response of an Ideal Polar Rubber," J. Appl. Phys., (2002), vol. 91, No. 3, pp. 1472-1476.

* cited by examiner

MICRO-OPTICAL SENSOR FOR ELECTRIC FIELD DETECTION

STATEMENT OF FEDERALLY FUNDED RESEARCH

This invention was made with U.S. Government support under Contract Nos. CBET-0809240 and DE-FG02-08ER85099 awarded by the NSF. The government has certain rights in this invention.

CROSS-REFERENCE TO RELATED APPLICATIONS

This patent application claims priority to U.S. Provisional Application Ser. No. 61/257,663 filed on Nov. 3, 2010, the contents of each of which are all incorporated by reference herein in their entirety.

TECHNICAL FIELD OF THE INVENTION

The present invention relates in general to the field of sensors, and more particularly, to the design of a micro-optical electric field sensor that measures temporally and spatially resolved electric field with an extremely high sensitivity.

INCORPORATION-BY-REFERENCE OF MATERIALS FILED ON COMPACT DISC

None.

BACKGROUND OF THE INVENTION

Without limiting the scope of the invention, its background is described in connection with electric field sensors.

U.S. Pat. No. 6,922,059 issued to Zank et al. (2005) discloses a detection system comprising inexpensive, miniaturized sensors for detecting electric field (E-field) disturbances. Such sensors are easily and covertly deployable and have low power consumption. The devices may incorporate visual or audio alerts and can include communications hardware for transmitting data for further processing of the electrostatic events.

United States Patent Application No. 20080238433 (Joutsenoja and Kyyny, 2008) describes a sensor product for electric field sensing. The sensor includes a substrate, at least one electrically conductive area on the surface of the substrate, an output, and at least one conductor between the at least one electrically conductive area and the output.

United States Patent Application No 20090091329 (Barsukov et al., 2009) discloses a sensor for marine measurements of an electric field, the sensor includes at least two electrodes; signal transmission means for transmitting measured signals from the sensor to a signal processing unit; at least two closed containers which are formed on a non-conductive material and are filled with an electrolyte; at least two flexible hoses formed of an electrically non-conductive material; there being attached in a fluid-communicating manner to each of the containers at least one first hose end, and a second hose end being open and attached to means for exact positioning of the second hose end; the hoses being arranged to be filled with a medium of the same type as that, in which the sensor is arranged to be immersed in an operative condition; and two containers forming a pair of containers, the two containers, relatively, being placed close to each other under approximately identical thermal, pressure and chemical conditions.

SUMMARY OF THE INVENTION

The present invention describes a whispering gallery mode (WGM)-based microsensor for electric field measurement based on the electrostriction effect on the WGM of polymeric microspheres. The electrostriction is the elastic deformation (strain) of a dielectric material under the force exerted by an electrostatic field. The deformation is accompanied by mechanical stress which perturbs the refractive index distribution in the sphere. Both strain and stress induce a shift in the WGM of the microsphere.

The sensor of the present invention exploits the morphology-dependent shifts of the optical modes of dielectric cavities and will measure temporally- and spatially-resolved electric field with extremely high sensitivity. By using different cavity geometries and materials, an unprecedented measurement range can be obtained. The measurement principle is based on the electrostriction effect on the optical modes of dielectric micro-resonators (or micro-cavities). The optical modes are commonly referred to as "whispering gallery modes" (WGM) or "morphology dependent resonances" (MDR). The electrostriction is the elastic deformation (strain) of a dielectric material under the force exerted by an electrostatic field. The deformation is accompanied by mechanical stress which perturbs the refractive index distribution in the micro-resonator. Both the strain and the stress induce a shift in the WGM of the resonator (cavity). By monitoring the WGM shifts, the electric field causing the electrostriction effect can be determined. Different sensitivities and measurement ranges (maximum measured electric field) can be obtained by using different cavity (resonator) geometries (for example solid or hollow spheres), polymeric materials (PMMA, PDMS, etc) as well as poling the dielectric material. Further, the same concept can be used to detect composition changes of gases including impurities in air. In addition to sensing, the sensor of the present invention can also be used as electrostatic field-driven fast, narrowband optical switches and filters. For example, such fast and high precision switches can find applications in the telecommunication field.

The present invention describes a micro-optical sensor device for a detection of an electric field comprising; one or more dielectric polymeric optical micro-cavities that may optionally be filled with one or more dielectric polymeric materials, or a dielectric liquid, wherein the micro-cavity can be a solid sphere, a hollow sphere, a cylinder, a disk, or any other suitable shape and an optical fiber weakly coupled to the one or more micro-cavities, wherein the optical fiber is coupled to the one or more micro-cavities at an exposed portion in the fiber, wherein a first end of the optical fiber is connected to a laser light source and a second end to a photodiode, wherein the optical fiber serves as both an input and an output port for the micro-cavity. The micro-cavity as described in an embodiment of the present invention is a microsphere. In one aspect the one or more polymeric materials are selected from the group consisting of polydimethylsiloxane (PDMA), poly (methyl methacrylate) (PMMA), polyimide, polyvinylidene fluoride, ethylene trifluoride and ethylene chloride trifluoride.

In another aspect the micro-optical sensor device of the present invention has a large optical quality factor $(Q)>10^5$ and a radius (R) of the dielectric micro-cavity greater than a vacuum wavelength ($\lambda$) of a laser light from the laser source, wherein $\lambda \ll R$. In yet another aspect of the present invention a shift in a position of an optical resonance in response to an external force on the optical micro-cavities is measured in a transmission spectrum. In specific aspects of the present invention the micro-sphere has a diameter of about 900 μm and the micro-optical sensor device has a resolution of about 500 V/m. In other aspects of the present invention the micro-sphere has diameters of 100 μm, 200 μm, 300 μm, 400 μm, 500 μm, 600 μm, 700 μm, 800 μm, 900 μm, 1 mm, 2 mm, and 5 mm and the micro-optical sensor device has a resolution of about 5 V/m, 10 V/m, 25 V/m, 50 V/m, 100 V/m, 200 V/m, 300 V/m, 400 V/m, 500 V/m, 600 V/m and 700 V/m.

In another embodiment the present invention provides a method for detecting and measuring a magnitude of an electric field using a dielectric polymeric micro-optical sensor device comprising the steps of: (i) placing the polymeric micro-optical sensor device in a medium of lower refractive index, wherein the medium comprises air, water, or a gas, wherein the micro-optical sensor device comprises one or more polymeric optical micro-spheres that may optionally be filled with one or more dielectric polymeric materials or a dielectric liquid and an optical fiber weakly coupled to the one or more micro-spheres, wherein the optical fiber is coupled to the one or more micro-spheres at an exposed portion in the fiber, wherein a first end of the optical fiber is connected to a laser light source and a second end to a photodiode, wherein the optical fiber serves as both an input and an output port for the micro-sphere, (ii) launching a light from the laser light source in a nearly tangential direction to the micro-sphere, (iii) monitoring a total internal reflection of the light inside the micro-sphere, (iv) monitoring for a shift in an optical resonance from an output from the photodiode, wherein the shift arises from a perturbation of a radius ($\Delta R$) and a refractive index ($\Delta n$) of the micro-sphere, and (v) detecting and determining the magnitude of an electric field based on the shift of the optical resonance of the micro-spheres. The method of the present invention monitors and detects the shift in the optical resonance is according to Equation (I):

$$\frac{\Delta R}{R} + \frac{\Delta n}{n_0} = \frac{\Delta \lambda}{\lambda} = \frac{\Delta v}{v} \qquad (I)$$

wherein, $\Delta R$=perturbation in the micro-sphere radius, R=radius of the micro-sphere, $\Delta n$=perturbation in the refractive index of the micro-sphere, $n_0$=refractive index of the micro-sphere, $\Delta \lambda$=perturbation in the vacuum wavelength of the laser light, $\lambda$=vacuum wavelength of the laser light, $\Delta v$=perturbation in the frequency of the laser light, and v=frequency of the laser light.

The micro-sphere described in the method of the present invention is a solid sphere or a hollow sphere. In a specific aspect the micro-sphere is a hollow PDMS sphere filled with water and is placed in air. Further, the hollow sphere is filled with a liquid having a large dielectric constant, wherein the liquids comprise water, water containing one or more electrolytes, an electrolytic solution or any combinations thereof.

In one aspect the one or more dielectric polymeric materials are selected from the group consisting of polydimethylsiloxane (PDMA), poly (methyl methacrylate) (PMMA), polyimide, polyvinylidene fluoride, ethylene trifluoride and ethylene chloride trifluoride. In another aspect one or more conductive materials may be optionally embedded on or inside the micro-spheres, wherein the one or more conductive materials comprise ferro-materials, electrically conducting materials or any combinations thereof. In yet another aspect the one or more dielectric polymeric materials may be optionally cured in an electric field.

In yet another embodiment the present invention discloses a set-up for measuring a shift in an optical resonance of a dielectric micro-cavity comprising: a solid PDMS micro-sphere on a silica stem, two or more electrodes connected to a DC voltage supply, wherein the solid PDMS micro-sphere is placed between the two or more electrodes, an optical fiber with one end of the optical fiber connected to a laser diode source, wherein a portion of the optical fiber is heated and stretched to form a tapered end, wherein the tapered end is coupled to the solid PDMS microsphere, and a laser controller connected to a function generator, wherein the laser controller current-tunes the laser source and the function generator provides a current input to the laser controller. In one aspect the set-up has a quality factor (Q) of about $10^6$ and measures the shift in the optical resonance is according to Equation (I):

$$\frac{\Delta R}{R} + \frac{\Delta n}{n_0} = \frac{\Delta \lambda}{\lambda} = \frac{\Delta v}{v} \qquad (I)$$

wherein, $\Delta R$=perturbation in the micro-sphere radius, R=radius of the micro-sphere, $\Delta n$=perturbation in the refractive index of the micro-sphere, $n_0$=refractive index of the micro-sphere, $\Delta \lambda$=perturbation in the vacuum wavelength of the laser light, $\lambda$=vacuum wavelength of the laser light, $\Delta v$=perturbation in the frequency of the laser light, and v=frequency of the laser light. In another aspect the PDMS of the solid micro-sphere has a diameter of about 900 μm.

In a further embodiment the present invention discloses a micro-optical sensor device for a detection of one or more impurities or contaminants in an liquid or gas comprising: one or more polymeric optical micro-cavities optionally filled with one or more dielectric polymeric materials, or a dielectric liquids wherein the micro-cavity can be a solid sphere, a hollow sphere, a cylinder, a disk, or any other suitable shape and an optical fiber weakly coupled to the one or more micro-cavities, wherein the optical fiber is couple to the one or more micro-cavities at an exposed portion in the fiber, wherein a first end of the optical fiber is connected to a laser light source and a second end to a photodiode, wherein the optical fiber serves as both an input and an output port for the micro-cavity. In specific aspects the micro-cavity is a hollow micro-sphere filled with water and comprises PDMS as the polymeric material. The sensor device as disclosed has an optical quality factor (Q) of nearly about $10^7$ and is capable of measuring a shift in a position of an optical resonance in response to a change in a refractive index in the liquid or the gas due to a presence of one or more impurities or contaminants. In other aspects the one or more polymeric materials are selected from the group consisting of polydimethylsiloxane (PDMS), poly (methyl methacrylate) (PMMA), polyimide, polyvinylidene fluoride, ethylene trifluoride and ethylene chloride trifluoride.

The present invention also provides a method for detecting one or more impurities or contaminants in a medium using a dielectric polymeric micro-optical sensor device comprising the steps of: (i) placing the polymeric micro-optical sensor device in the medium, wherein the medium comprises air, water, or a gas, wherein the micro-optical sensor device comprises one or more hollow PDMS micro-spheres filled with water and an optical fiber weakly coupled to the one or more micro-spheres, wherein the optical fiber is couple to the one or more micro-spheres at an exposed portion in the fiber, wherein a first end of the optical fiber is connected to a laser light source and a second end to a photodiode, wherein the optical fiber serves as both an input and an output port for the micro-sphere, (ii) launching a light from the laser light source in a nearly tangential direction to the micro-sphere, (iii) monitoring a total internal reflection of the light inside the micro-sphere, (iv) monitoring for a shift in an optical resonance from an output of the photodiode, wherein the shift arises from a perturbation of a radius ($\Delta R$) and a refractive index ($\Delta n$) of the micro-sphere caused by a presence of one or more impurities or contaminants in the medium, and (v) detecting and determining the one or more impurities or contaminants based on the shift of the optical resonance of the micro-spheres. According to the embodiment of the present invention the shift in the optical resonance is according to Equation (I):

$$\frac{\Delta R}{R} + \frac{\Delta n}{n_0} = \frac{\Delta \lambda}{\lambda} = \frac{\Delta v}{v} \quad (I)$$

wherein, $\Delta R$=perturbation in the micro-sphere radius, R=radius of the micro-sphere, $\Delta n$=perturbation in the refractive index of the micro-sphere, $n_0$=refractive index of the micro-sphere, $\Delta \lambda$=perturbation in the vacuum wavelength of the laser light, $\lambda$=vacuum wavelength of the laser light, $\Delta v$=perturbation in the frequency of the laser light, and v=frequency of the laser light.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

Figure 1A:
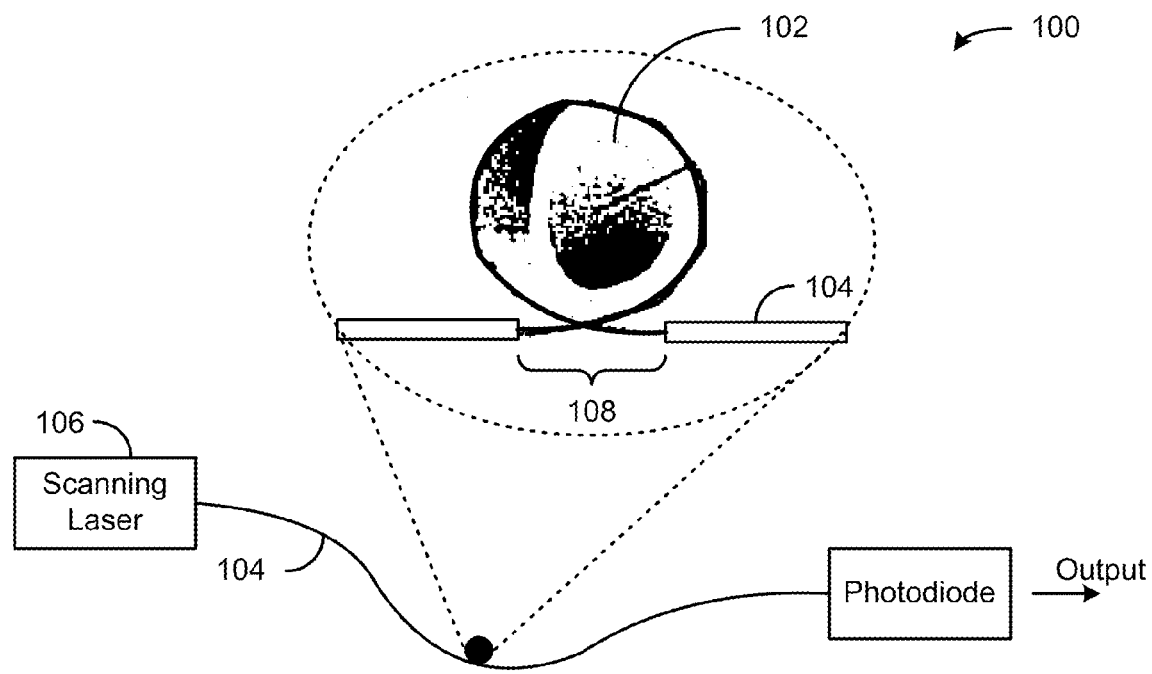
FIG. 1A is a schematic illustration of the WGM sensor of the present invention.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The present invention discloses a novel electric field sensor. The micro-optical sensor technology of the present invention is compact (sensor volumes can be smaller than a cubic millimeter) and can provide high-sensitivity measurements of the electric field. The measurement principle is based on the monitoring of optical modes (also called the "whispering gallery modes" or "WGM" or morphology dependent resonances" or "MDR") of dielectric micro-cavities (such as solid and hollow spheres, cylinders rings, etc).

Light from a scanning laser is coupled into one end of an optical fiber and its transmission spectrum is monitored by a photo-detector on the other end. The dielectric cavity is brought into contact with a tapered section of the fiber allowing for the monitoring of the optical modes (WGM) of the cavity which is part of the sensor. The WGMs are highly sensitive to the morphology of the cavity (including size, shape and optical properties). A perturbation to any of these morphological features of the cavity shifts the WGM position in the transmission spectrum through the optical fiber. The electric field (to be detected) will exert a Coulomb force on the cavity perturbing its morphology. This will lead to a shift in the WGM. By monitoring the WGM shifts, the electric field can be measured. Different sensitivities and measurement ranges can be obtained by using different micro-cavity materials and geometries. Further, the same concept can be used to detect composition changes of gases including impurities in air. In addition to sensing, the technology can also be used as electrostatic field-driven fast, narrowband optical switches and filters. For example, such fast and high precision switches could find application in the telecommunication field.

The inventors have also developed analytical expressions for the WGM shift due to electrostriction for solid and thin-walled hollow microspheres. Results of the analysis indicates that detection of electric fields as small as ~500V/m may be possible using water filled, hollow solid polydimethylsiloxane (PDMS) microspheres. Higher sensitivities can be obtained using other liquids with higher dielectric constants as fill and shell materials with polling.

Figure 1B:
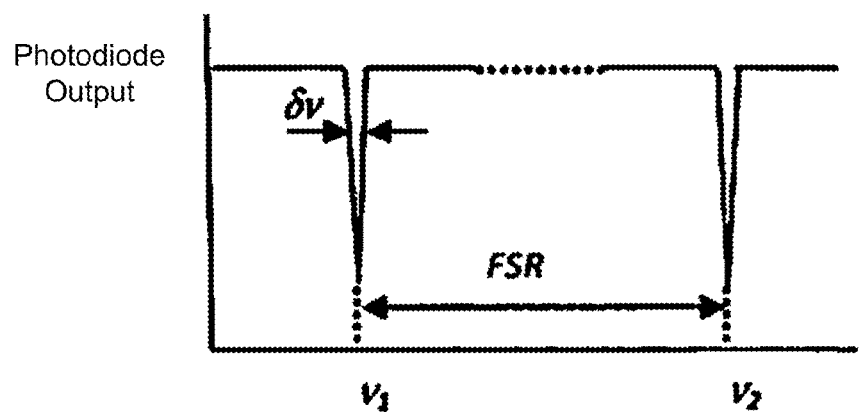
FIG. 1B shows the output of the WGM sensor of the present invention showing the optical resonances in the transmission spectrum.

FIG. 1A is a schematic illustration of the WGM sensor 100 of the present invention. The sensing element 102 is a micro-cavity (typically a micro-sphere although other geometries such as cylinders, disks, can also be used) that is weakly coupled to an optical fiber 104. The optical fiber 104, which carries light from a tunable laser 106, serves as an input/output port for the micro-sphere 102. When the sphere 102 comes into contact with a section of the exposed or partially exposed core 108 of the fiber 104, its WGMs are observed as sharp dips in the transmission spectrum as shown in FIG. 1B. These optical resonances are extremely narrow and hence are highly sensitive to any change in the morphology of the sphere (including its shape, size and refractive index). A minute change in any of these attributes of sphere will cause a shift in the resonance positions allowing for the precise measurement of the effect causing the deformation.

The principle of the disclosed optical sensor of the present invention provides a considerably finer measurement resolution than any of the other optical method in this class. including frequency selective fiber-based Fabry-Perot interferometers and Fiber-Bragg gratings. This is due to the fact that the optical quality factor, Q, of Fabry-Perot and Bragg grating techniques are several orders of magnitude smaller (in the order<1000) than the sensor of the present invention (which can reach values $Q>10^7$). Further, due to the optical attributes, the sensor of the present invention can be built with much smaller sensing element sizes than what is possible with the currently available optical and non-optical methods. Thus, the compact and robust electric field micro-sensors can be incorporated into optical sensor arrays for distributed measurements.

The diameter of the dielectric cavity 102 (such as a sphere) can vary depending on the application as long as the condition, $\lambda \ll R$, is met to ensure large Q factors (here, $\lambda$ is the vacuum wavelength of the laser light and R is the sphere radius). The laser light from a tapered section 108 of the optical fiber 104 is coupled into the sphere 102 through optical tunneling. This way, the light is launched into the sphere nearly tangentially. It circles the interior of the sphere 102 through total internal reflection (as long as the refractive index of the sphere 102 is larger than that of the surrounding medium) and returns in phase. The condition for optical resonance is $2\pi R n_0 = l\lambda$, where l is an integer and $n_0$ is the sphere refractive index. In terms of frequency, $\lambda$, this condition is $\lambda = (c/2\pi R n_0) l$ with c being the speed of light in vacuum. The above condition is valid for $R \gg \lambda$. Any external effect applied on the sphere will cause a perturbation on both the radius ($\Delta R$) and refractive index ($\Delta n$) leading to a shift in the optical resonance (WGM) as follows:

$$\frac{\Delta R}{R} + \frac{\Delta n}{n_0} = \frac{\Delta \lambda}{\lambda} = \frac{\Delta v}{v} \quad (I)$$

Therefore, any change in the physical condition of the surrounding that induces a change in index of refraction or radius of the microsphere 102 can be sensed by monitoring the WGM shifts. As illustrated in FIG. 1B, the WGMs are observed as sharp dips in the transmission spectrum through the fiber. A key factor that makes this phenomenon attractive for sensor applications is the unusually large optical quality factors, Q, that the modes exhibit. The observed line-width, $\delta v$, is related to the optical quality factor as:

$$Q = \frac{v}{\delta v} = \frac{\lambda}{\delta \lambda} \quad (II)$$

The smaller the energy loss inside the sphere, the higher the Q-factor. The principle advantage of WGM-based sensor concept is that WGMs of dielectric microspheres provide exceptionally large Q-factors that cannot be matched by planar interferometric systems such as Fabry-Perot instruments and brag gratings. For fused silica, microspheres 102 with optical configurations shown in FIG. 1A. Q values approaching the material loss limit of $10^{10}$ have been reported. In our earlier studies, we routinely obtained optical Q values in the range of $10^6$ to $10^7$ with polymeric spheres. Note that the observed line-width is linked with the measurement resolution. In the technique of the present invention, the inventors exploit the effect of an electrostatic field on the WGM of high optical quality dielectric polymeric (such as PDMS, PMMA, etc) spheres or other cavity shapes. If the inductive capacity of the dielectric sphere 102 is different than that of the surrounding medium (air, water, etc), the electrostatic field that it is subjected to will exert a force on the sphere 102. This force, in turn, will deform the sphere 102 and cause a mechanical stress field within the sphere 102 (which will perturb the refractive index of the sphere 102). This in return will lead to a WGM shift according to equation (I). If this shift is monitored in the fashion depicted in FIG. 1A, the field magnitude can be determined. The sensitivity of the measurement depends on the amount of deformation and mechanical stress for a given applied electrostatic field. Several methods can be used to increase the measurement sensitivity including; using softer sphere materials or hollow spheres (both of which result in larger deformation for a given applied force due to electrostriction), and increasing the inductive capacity difference between the sphere and the surrounding medium (which results in a larger induced force for a given electric field). Further, if a hollow sphere is used as a sensor, it can be filled with a fluid with a large dielectric constant (which, again, increases the applied force for a given electric field). Other methods can also be used to increase measurement sensitivity including (i) embedding conductive materials on or inside the sphere to create larger forces and (ii) curing a polymeric sphere under electric field to create poling of the material. Electrostriction-induced shifts could be exploited for WGM-based electric field and gas composition sensing. Conversely, such cavities can also be used as electrostatic-driven optical switches and filters, rather than sensors. For example, such fast and high precision switches could find application in the telecommunication field. In the present invention, the WGM cavity is tuned through the applied voltage.

As a result, one embodiment of the present invention provides a micro-optical sensor device to detect an electric field that includes a sensing element comprising a dielectric micro-cavity, and an optical fiber having an optical input, an optical output and a section coupled to a circumference of the dielectric micro-cavity such that a change in an refractive index or a radius of the dielectric micro-cavity as a result of electrostriction caused by the electric field creates a shift in an optical resonance (whispering gallery mode) that is detected at the optical output. The dielectric micro-cavity can be filled with one or more dielectric polymeric materials, or a dielectric liquid. Moreover, the dielectric micro-cavity can be a solid sphere, a hollow sphere, a cylinder, a disk, or any other suitable geometric shape. For example, the dielectric micro-cavity can be a micro-sphere having a diameter in a range of about 100 μm to 5 mm. The radius (R) of the dielectric micro-cavity can be greater than a vacuum wavelength ($\lambda$) of a laser light from the laser light source, wherein $\lambda \ll R$ The dielectric polymeric materials are selected from the group consisting of polydimethylsiloxane (PDMA), poly (methyl methacrylate) (PMMA), polyimide, polyvinylidene fluoride, ethylene trifluoride and ethylene chloride trifluoride. Typically, a laser light source is connected to the optical input of the optical fiber, and a photodiode is connected to the optical output of the optical fiber. The shift in the optical resonance is according to Equation (I). The device may have a large optical quality factor (Q)>105 and/or a resolution in a range of about 5 V/m to 700 V/m. Finally, the device can be used as an electrostatic field-driven optical switch or filter.

The present invention also provides a method of detecting and measuring a magnitude of an electric field using a dielectric micro-cavity sensor device by: (a) placing the dielectric micro-cavity sensor device in a medium having a lower refractive index, wherein the micro-optical sensor device comprises one or more dielectric micro-cavities and an optical fiber having an optical input, an optical output and a section coupled to a circumference of the dielectric micro-cavities such that a change in an refractive index or a radius of the dielectric micro-cavities as a result of electrostriction caused by the electric field creates a shift in an optical resonance (whispering gallery mode); (b) providing a light from a laser light source to the optical input of the optical fiber; (c) detecting any shift in the optical resonance of the dielectric micro-cavities using a photodiode connected to the optical output of the optical fiber; and (d) determining a magnitude of the electric field from the detected shift in the optical resonance of the dielectric micro-cavities. The medium can be air, water, or a gas. The dielectric micro-cavity can be is filled with one or more dielectric polymeric materials, or a liquid having a large dielectric constant, wherein the liquids comprise water, water containing one or more electrolytes, an electrolytic solution or any combinations thereof. The dielectric micro-cavity can be a solid sphere, a hollow sphere, a cylinder, a disk, or any other suitable geometric shape. The dielectric polymeric materials are selected from the group consisting of polydimethylsiloxane (PDMA), poly (methyl methacrylate) (PMMA), polyimide, polyvinylidene fluoride, ethylene trifluoride and ethylene chloride trifluoride. The one or more dielectric polymeric materials can be cured in an electric field. The dielectric micro-cavity can be a hollow PDMS sphere filled with water, wherein the micro-sphere is placed in air. One or more conductive materials can be embedded on or inside the micro-cavities, wherein the one or more conductive materials include ferro-materials, electrically conducting materials or any combinations thereof.

Another embodiment of the present invention provides a micro-optical sensor device to detect one or more impurities or contaminants in an liquid or gas that includes a sensing element comprising a dielectric micro-cavity, and an optical fiber having an optical input, an optical output and a section coupled to a circumference of the dielectric micro-cavity such that a change in an refractive index of the liquid or gas due to a presence of one or more impurities or contaminants creates a shift in an optical resonance (whispering gallery mode) that is detected at the optical output when the dielectric micro-cavity is located in the liquid or gas. The dielectric micro-cavity can be filled with one or more dielectric polymeric materials, or a dielectric liquid. Moreover, the dielectric micro-cavity can be a solid sphere, a hollow sphere, a cylinder, a disk, or any other suitable geometric shape. For example, the dielectric micro-cavity can be a micro-sphere having a diameter in a range of about 100 μm to 5 mm. The radius (R) of the dielectric micro-cavity can be greater than a vacuum wavelength ($\lambda$) of a laser light from the laser light source, wherein $\lambda \ll R$ The dielectric polymeric materials are selected from the group consisting of polydimethylsiloxane (PDMA), poly (methyl methacrylate) (PMMA), polyimide, polyvinylidene fluoride, ethylene trifluoride and ethylene chloride trifluoride. Typically, a laser light source is connected to the optical input of the optical fiber, and a photodiode is connected to the optical output of the optical fiber. The shift in the optical resonance is according to Equation (I). The device may have a large optical quality factor (Q)>105 and/or a resolution in a range of about 5 V/m to 700 V/m. Finally, the device can be used as an electrostatic field-driven optical switch or filter.

The present invention also provides a method of detecting one or more impurities or contaminants in a medium using a dielectric micro-cavity sensor device by: (a) placing the dielectric micro-cavity sensor device in the medium, wherein the micro-optical sensor device comprises one or more dielectric micro-cavities and an optical fiber having an optical input, an optical output and a section coupled to a circumference of the dielectric micro-cavities such that a change in an refractive index of the medium caused by the one or more impurities or contaminants creates a shift in an optical resonance (whispering gallery mode); (b) providing a light from a laser light source to the optical input of the optical fiber; and (c) detecting the one or more impurities or contaminants by detecting the shift in the optical resonance of the dielectric micro-cavities using a photodiode connected to the optical output of the optical fiber. The medium can be air, water, or a gas. The dielectric micro-cavity can be is filled with one or more dielectric polymeric materials, or a liquid having a large dielectric constant, wherein the liquids comprise water, water containing one or more electrolytes, an electrolytic solution or any combinations thereof. The dielectric micro-cavity can be a solid sphere, a hollow sphere, a cylinder, a disk, or any other suitable geometric shape. The dielectric polymeric materials are selected from the group consisting of polydimethylsiloxane (PDMA), poly (methyl methacrylate) (PMMA), polyimide, polyvinylidene fluoride, ethylene trifluoride and ethylene chloride trifluoride. The one or more dielectric polymeric materials can be cured in an electric field. The dielectric micro-cavity can be a hollow PDMS sphere filled with water, wherein the micro-sphere is placed in air. One or more conductive materials can be embedded on or inside the micro-cavities, wherein the one or more conductive materials include ferro-materials, electrically conducting materials or any combinations thereof.

Whispering gallery modes (WGM) of dielectric microspheres have attracted interest with proposed applications in a wide range of areas due to the high optical quality factors that they can exhibit. The WGM (also called the morphology dependent resonances MDR) are optical modes of dielectric cavities such as spheres. These modes can be excited, for example, by coupling light from a tunable laser into the sphere using an optical fiber. The modes are observed as sharp dips in the transmission spectrum at the output end of the fiber typically with very high quality factors, $Q = \lambda/\delta\lambda$ ($\lambda$ is the wavelength of the interrogating laser and $\delta\lambda$ is the line width of the observed mode, (see FIG. 1B). The proposed WGM applications include those in spectroscopy [1], micro-cavity laser technology [2], and optical communications (switching [3] filtering [4] and wavelength division and multiplexing [5]). For example, mechanical strain [6] and thermooptical [3] tuning of microsphere WGM have been demonstrated for potential applications in optical switching. Several sensor concepts have also been proposed exploiting the WGM shifts of microspheres for biological applications [7,8] trace gas detection [9], impurity detection in liquids [10] as well as mechanical sensing including force [11,12], pressure [13], temperature [14] and wall shear stress [15]. The following discussion investigates the effect of an electrostatic field on the WGM shifts of a polymeric microsphere. Such electrostriction-induced shifts could be exploited for WGM-based gas composition and electric field sensors. The concept of an electric field detector based on the WGM of a micro-disk was discussed recently [16]. Potentially, the electrostatic field-driven micro-cavities could also be used as fast, narrowband optical switches and filters.

The simplest interpretation of the WGM phenomenon comes from geometric optics. When laser light is coupled into the sphere nearly tangentially, it circumnavigates along the interior surface of the sphere through total internal reflection. A resonance (WGM) is realized when light returns to its starting location in phase. A common method to excite WGMs of spheres is by coupling tunable laser light into the sphere via an optical fiber [5,10]. The approximate condition for resonance is:

$$2\pi n_0 a = l\lambda \tag{1}$$

where $\lambda$ is the vacuum wavelength of laser, $n_0$ and a are the refractive index and radius of sphere respectively, and l is an integer representing the circumferential mode number. Equation (1) is a first order approximation and holds for a>>$\lambda$. A minute change in the size or the refractive index of the microsphere will lead to a shift in the resonance wavelength as $$\frac{d\lambda}{\lambda} = \frac{dn_0}{n_0} + \frac{da}{a} \tag{2}$$

Variation of the electrostatic field will cause changes both in the sphere radius (strain effect) and index of refraction (stress effect) leading to a WGM shift, as indicated in Eq. (2). In the following, we develop analytical expressions to describe the WGM shift of polymeric microspheres caused by an external electrostatic field. The analysis takes into account both the strain and stress effects.

Figure 1C:
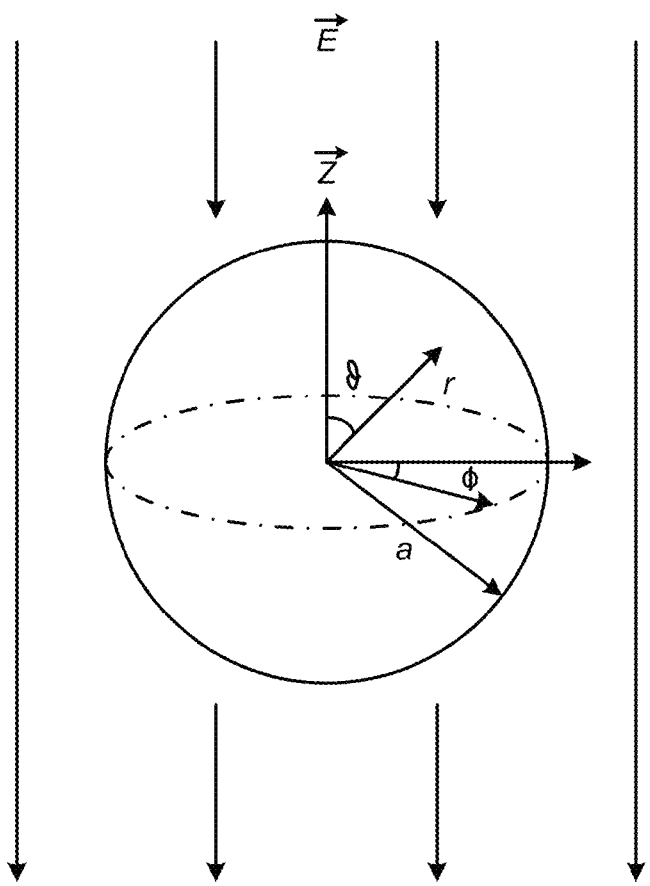
FIG. 1C is a schematic illustration of a dielectric solid sphere-based sensor in electric field.

Electrostatic Field-Induced Stress in a Solid Dielectric Sphere:

Consider an isotropic solid dielectric sphere of radius a and inductive capacity $\in_1$, embedded in an inviscid dielectric fluid of inductive capacity $\in_2$. The sphere is subjected to a uniform electric field $E_0$ in the direction of negative z as shown in FIG. 1C.

The force exerted by the electrostatic field on the sphere will induce an elastic deformation (electrostriction) that is governed by the Navier Equation [17]:

$$\nabla^2 u + \frac{1}{1-2v}\nabla\nabla\cdot u + \frac{f}{G} = 0 \tag{3}$$

where u is the displacement of a given point within the dielectric sphere, $v$, is the Poisson ratio, G is the shear modulus, and f is the body force. Neglecting gravitational effect, the body force is due to the electric field, and is given by [18]:

$$f = -\frac{1}{2}\vec{E}^2\nabla\varepsilon_1 - \frac{1}{4}(a_1 + a_2)\nabla\vec{E}^2 \tag{4}$$

where $\vec{E}$ is the electric field within the sphere, $\in$ is the inductive capacity, $a_1$ and $a_2$ are coefficients that describe the dielectric properties. Physically, the parameter $a_1$ represents the change of inductive capacity $\in$ due to an elongation parallel to the lines of the field, while $a_2$ determines this change for elongation in normal direction to the field. In this analysis, the present inventors assumed that the electric and elastic properties of the microsphere in the unstrained configuration are isotropic. Therefore the first term on the right hand side of Eq. (4) is zero. The electric field inside the dielectric sphere is uniform and parallel to the z axis, with its magnitude [18]:

$$E = \frac{3\varepsilon_2}{\varepsilon_1 + 2\varepsilon_2}E_0 \tag{5}$$

Therefore, the second term on the right hand side of Eq. (4) is also zero. Thus, Eq. (3) becomes:

$$\nabla^2 u + \frac{1}{1-2v}\nabla\nabla\cdot u = 0 \tag{6}$$

The solution of this equation in spherical coordinates is given by [14]:

$$u_r = \sum [A_n(n+1)(n-2+4v)r^{n+1} + B_n n r^{n-1}]P_n(\cos\vartheta) \tag{7}$$
$$u_\vartheta = \sum [A_n(n+1)(n+5-4v)r^{n+1} + B_n n r^{n-1}]\frac{dP_n(\cos\vartheta)}{d\vartheta}$$

where $u_r$ and $u_\vartheta$ are the components of displacement in the radial, r, and polar, $\vartheta$ directions. $P_n$'s represent the Legendre polynomials, and $A_n$ and $B_n$ are constants that are determined by satisfying the boundary conditions.

Using the stress displacement equations, the components of stress can be expressed as:

$$\sigma_{rr} = \tag{8}$$
$$2G\sum [A_n(n+1)(n^2 - n - 2 - 2v)r^n + B_n n(n-1)r^{n-2}]P_n(\cos\vartheta)$$

$$\sigma_{\vartheta\vartheta} = \tag{9}$$
$$-2G\sum \left\{ \begin{array}{l} [A_n(n^2 + 4n + 2 + 2v)(n+1)r^n + B_n n^2 r^{n-2}]P_n(\cos\vartheta) + \\ [A_n(n+5-4v)r^n + B_n r^{n-2}]\cot(\vartheta)\frac{dP_n(\cos\vartheta)}{d\vartheta} \end{array} \right\}$$

$$\sigma_{\phi\phi} = \tag{10}$$
$$2G\sum \left\{ \begin{array}{l} [A_n(n+1)(n-2-2v-4nv)r^n + B_n n r^{n-2}]P_n(\cos\vartheta) + \\ [A_n(n+5-4v)r^n + B_n r^{n-2}]\cot\vartheta\frac{dP_n(\cos\vartheta)}{d\vartheta} \end{array} \right\}$$

$$\sigma_{r\vartheta} = 2G\sum [A_n(n^2 + 2n - 1 + 2v)r^n + B_n(n-1)r^{n-2}]\frac{\partial P_n(\cos\vartheta)}{\partial\vartheta} \tag{11}$$

In an inviscid fluid, only normal (pressure) forces are acting on the sphere. The normal force per unit area acting on the interface of the two dielectrics (the sphere and its surrounding) is given by [18]:

$$P = [\alpha\vec{E}(\vec{E}\cdot\vec{n})]_2 + [\alpha\vec{E}(\vec{E}\cdot\vec{n})]_1 - [\beta E^2\vec{n}]_2 - [\beta E^2\vec{n}]_1 \tag{12}$$

Where $\vec{n}$ is the unit surface normal vector. The subscripts indicate that the values are to be taken on either side of the interface (1 represents the sphere and 2 represents the surrounding medium). The constants $\alpha$ and $\beta$ are given as [18]:

$$\alpha = \varepsilon + \frac{a_2 - a_1}{2}, \beta = \frac{\varepsilon + a_2}{2} \quad (13)$$

For the case of a sphere embedded in a dielectric fluid, the constants $a_1$ and $a_2$ are defined by the Clausius-Mossotti law [15] leading to:

$$\alpha = \varepsilon, \beta = -\frac{\varepsilon_0}{6}(k^2 - 2k - 2) \quad (14)$$

for the fluid (medium 2). Here, $\varepsilon_0$ is the inductive capacity of vacuum, and k ($k=\varepsilon/\varepsilon_0$) is the dielectric constant. Using Eq. (5) and Eq. (12) the pressure acting at the dielectric interface is given by:

$$P = (A' - B')\cos(\vartheta)^2 + B' \quad (15)$$

where A' and B' are defined as:

$$A' = \left(\frac{3\varepsilon_2}{\varepsilon_1 + 2\varepsilon_2}E_0\right)^2 \left[\left(\frac{\varepsilon_1}{\varepsilon_2}\right)^2(\alpha_2 - \beta_2) - \alpha_1 + \beta_1\right] \quad (16)$$

$$B' = \left(\frac{3\varepsilon_2}{\varepsilon_1 + 2\varepsilon_2}E_0\right)^2 (\beta_1 - \beta_2) \quad (17)$$

Equation (15) represents the pressure acting on the sphere surface due to the inductive capacity discontinuity at the sphere-fluid interface. Apart from this, the electric field induces a pressure perturbation in the fluid as well. This is given by $$P = \frac{\varepsilon_0}{6}E^2(k_2 - 1)(k_2 + 2) \quad (18)$$

For gas media, $k \approx 1$, thus $\delta P$ is negligible.

In order to define the stress and strain distributions within the sphere, coefficient $A_n$ and $B_n$ have to be evaluated. These coefficients are calculated by satisfying the following boundary conditions.

$$\sigma_{rr}(a) = P$$

$$\sigma_{r\vartheta}(a) = 0 \quad (19)$$

The coefficient $A_n$ and $B_n$ are determined by expanding the pressure P in terms of Legendre series as follows:

$$P = \Sigma Z_n P_n(\cos \vartheta) \quad (20)$$

From Eq. (15), it can be noted that only two terms of the series in Eq. (20) are needed to describe the pressure distribution, from which the coefficients $Z_n$ are defined as:

$$Z_o = \frac{1}{3}(A' + 2B'), Z_2 = \frac{2}{3}(A' - B') \quad (21)$$

Plugging Eq. (8,11) and Eq. (20, 21), into Eq. (19), the coefficients $A_n$ and $B_n$ are determined as follows:

$$A_0 = -\frac{(A' + 2B')}{12G(1+v)}, \quad (22)$$

$$A_2 = -\frac{(A' - B')}{6Ga^2(5v+7)},$$

$$B_2 = \frac{(A' - B')(2v+7)}{6G(5v+7)}$$

The radial deformation can be determined by using Eq. (7):

$$u_r = 2A_0(2v-1)r + (12A_2vr^3 + 2B_2r)^{1/2}(3\cos(\vartheta)^2 - 1) \quad (23)$$

WGM Shift in a Solid Sphere Due to Electrostriction:

The last term in Eq. (2) (the relative change in the optical path length in the equatorial belt of the microsphere at r=a and $\vartheta = \pi/2$) can be evaluated by plugging Eq. (22) into Eq. (23):

$$\frac{da}{a} = \quad (24)$$

$$\left(\frac{3\varepsilon_2}{\varepsilon_1 + 2\varepsilon_2}E_0\right)^2 \left\{ \begin{array}{l} \frac{(1-2v)}{6G(1+v)}\left[\left(\left(\frac{\varepsilon_1}{\varepsilon_2}\right)^2(\alpha_2 - \beta_2) - \alpha_1 + 3\beta_1 - 2\beta_2\right)\right] + \\ \frac{(4v-7)}{3G(5v+7)}\left[-\left(\frac{\varepsilon_1}{\varepsilon_2}\right)^2(\alpha_2 - \beta_2) + \alpha_1 - \beta_2\right] \end{array} \right\}$$

From the above expression, it can be seen that the radial deformation, da/a, has a quadratic dependence on the electric field strength.

The inventors determined the effect of stress on refractive index perturbation, $dn_0/n_0$, in Eq. (2). The inventors neglected the effect of the electric field on the index of refraction of the microsphere. The Neumann-Maxwell equations provide a relationship between stress and refractive index as follows [19]:

$$n_r = n_{or} + C_1\sigma_{rr} + C_2(\sigma_{\vartheta\vartheta} + \sigma_{\phi\phi})$$

$$n_\vartheta = n_{o\vartheta} + C_1\sigma_{\vartheta\vartheta} + C_2(\sigma_{rr} + \sigma_{\phi\phi})$$

$$n_\phi = n_{o\phi} + C_1\sigma_{\phi\phi} + C_2(\sigma_{\vartheta\vartheta} + \sigma_{rr}) \quad (25)$$

Here $n_r$, $n_\vartheta$, $n_\phi$ are the refractive indices in the direction of the three principle stresses and $n_{or}$, $n_{o\vartheta}$, $n_{o\phi}$ are those values for the unstressed material. Coefficients $C_1$ and $C_2$ are the elasto-optical constants of the material. In the present disclosure the inventors consider PDMS microspheres that are manufactured as described in [15]. For PDMS these values are $C_1 = C_2 = C = -1.75 \times 10^{-10}$ m$^2$/N [20]. Thus, for a spherical sensor, the fractional change in the refractive index due to mechanical stress is reduced to:

$$\frac{dn_o}{n_o} = \frac{n_r - n_{or}}{n_{or}} \quad (26)$$

$$= \frac{n_\vartheta - n_{o\vartheta}}{n_{o\vartheta}}$$

$$= \frac{n_r - n_{o\varphi}}{n_{o\varphi}}$$

$$= \frac{C(\sigma_{rr} + \sigma_{\vartheta\vartheta} + \sigma_{\varphi\varphi})}{n}$$

Figure 2:
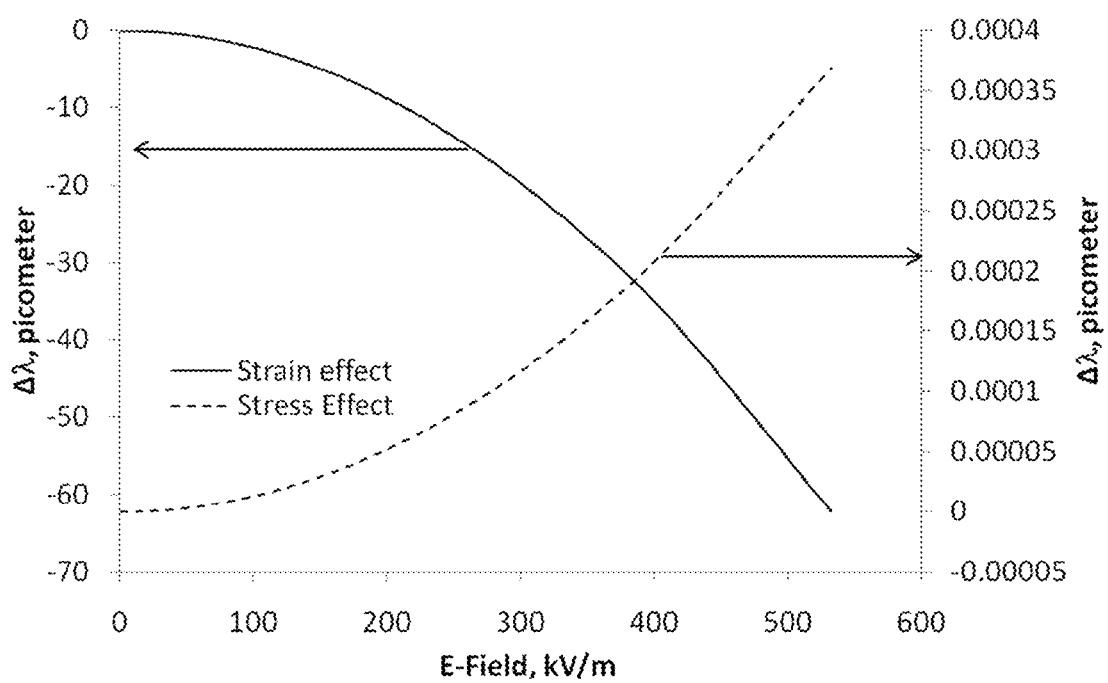
FIG. 2 is a plot showing the WGM shift of a solid 1 mm diameter PDMS sphere due to applied electric field (base-to-curing-agent ratio of 60:1, sphere radius-to-laser wavelength ratio of a/$\lambda$=381)

Thus, evaluating the appropriate expressions for stress in Eq. (8, 9, 10) at $\vartheta = \pi/2$ and r=a, and introducing them into Eq. (26) the relative change in the refractive index can be obtained. In order to evaluate the WGM shift due to the applied electric field, the constants $a_1$ and $a_2$ must be evaluated. Very few reliable measurements of these constants for solids have been reported in the literature. There are no experimental measurements of $a_1$ and $a_2$ for polymeric material including PDMS. In the present analysis the inventors took the values developed for an ideal polar rubber [21]. In FIG. 2, the strain (da/a) and stress ($dn_0/n_0$) effects on the WGM shifts due to an electric field are shown. The stress and strain have opposite effects on WGM shifts, but as seen in the figure, the strain effect dominates over that of stress and thus, the latter effect can be ignored in calculations. By assuming the minimum measurable WGM shift is $\Delta\lambda=\lambda/Q$, the measurement resolution is defined as $\delta E=(\lambda/Q)(d\lambda/dE)^{-1}$. The results of FIG. 2 indicate that for a quality factor of $Q\sim 10^7$ an electric field as small as ~20 kV/m can be resolved with a solid PDMS microsphere (polymeric base to curing agent ratio of 60:1 by volume).

Figure 3:
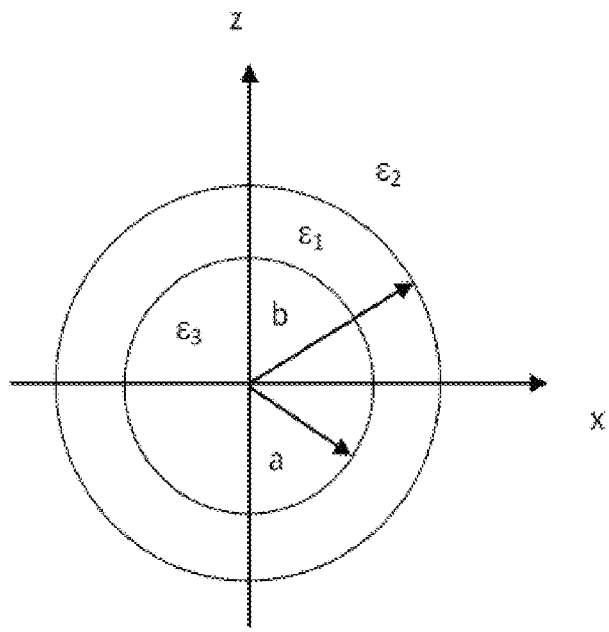
FIG. 3 is a schematic illustration of an electrostatic field-induced stress in a hollow dielectric sphere to be used as sensor.

Electrostatic Field-Induced Stress in a Hollow Dielectric Sphere:

Consider a dielectric spherical shell of inductive capacity $\in_1$ with inner radius a and outer radius b that is placed in a uniform dielectric fluid of inductive capacity $\in_2$ as shown in FIG. 3. The shell is filled with a fluid of inductive capacity $\in_3$. As in the solid microsphere case, in order to determine the WGM shift, the strain distribution at the sphere outer surface must be known. In order to find this distribution the pressure acting at the surfaces, as well as the body force inside the shell has to be determined. In general, both the pressure and the body force are functions of the electric field distribution.

The electric field distribution in a dielectric is governed by Laplace's equation. The general solution of Laplace's equation in spherical coordinates $(r, \vartheta, \phi)$ is given as:

$$\Phi(r, \vartheta, \phi) = \sum_{i=0} (A_i r^i + B_i r^{-i-1}) P_i(\cos\vartheta) \quad (27)$$

where $\Phi$ is the potential function. From the above equation, the potential function in each medium can be written as:

$$\Phi_1 = B\sqrt{\frac{a}{b}} \left(\frac{r}{a}\right)\cos\vartheta + C\left(\frac{b}{a}\right)\left(\frac{a}{r}\right)^2 \cos\vartheta \quad (28)$$

$$\Phi_2 = -E_0 b\left(\frac{r}{b}\right)\cos\vartheta + D\left(\frac{b}{r}\right)^2 \cos\vartheta$$

$$\Phi_3 = A\left(\frac{r}{a}\right)\cos\vartheta$$

Constant A, B, C, D are determined by satisfying the boundary condition at each interface, which are defined as:

$$\Phi_3(a) = \Phi_1(a) \qquad \Phi_1(b) = \Phi_2(b) \quad (29)$$
$$\varepsilon_3 \frac{\partial \Phi_3}{\partial r}\bigg|_a = \varepsilon_1 \frac{\partial \Phi_1}{\partial r}\bigg|_a, \quad \varepsilon_1 \frac{\partial \Phi_1}{\partial r}\bigg|_b = \varepsilon_2 \frac{\partial \Phi_2}{\partial r}\bigg|_b$$

The coefficients are obtained by solving the following linear system:

$$\begin{pmatrix} \alpha_{12} & \alpha_{12} & \alpha_{13} & \alpha_{14} \\ \alpha_{21} & \alpha_{22} & \alpha_{23} & \alpha_{24} \\ \alpha_{31} & \alpha_{32} & \alpha_{33} & \alpha_{34} \\ \alpha_{41} & \alpha_{42} & \alpha_{43} & \alpha_{44} \end{pmatrix} \cdot \begin{pmatrix} A \\ B \\ C \\ D \end{pmatrix} = \begin{pmatrix} \gamma_1 \\ \gamma_2 \\ \gamma_3 \\ \gamma_4 \end{pmatrix} \quad (30)$$

The matrix coefficient $\alpha_{ij}$ and $\gamma_i$ are:

$$\alpha_{11} = \alpha_{24} = -1, \; \alpha_{12} = \sqrt{\frac{a}{b}}, \; \alpha_{13} = \frac{b}{a}, \; \alpha_{14} = \alpha_{21} = \alpha_{34} = 0,$$

$$\alpha_{22} = \sqrt{\frac{b}{a}}, \; \alpha_{23} = \frac{a}{b}, \; \alpha_{31} = \frac{\varepsilon_1}{a\varepsilon_2}, \; \alpha_{32} = -\frac{1}{\sqrt{ab}}, \; \alpha_{33} = \frac{2b}{a^2},$$

$$\alpha_{43} = \frac{2a}{b}, \; \alpha_{42} = -\frac{1}{\sqrt{ab}}, \; \alpha_{44} = -\frac{\varepsilon_3}{\varepsilon_2}\frac{2}{b},$$

$$\gamma_1 = \gamma_3 = 0, \; \gamma_2 = -E_0 b, \; \gamma_4 = \frac{\varepsilon_3}{\varepsilon_2} E_0$$

$$\delta_{11} = -6va^2, \; \delta_{12} = \delta_{22} = 2, \; \delta_{13} = -\frac{2}{a^3}(10 - 2v), \; \delta_{14} = \frac{12}{a^5},$$

$$\delta_{21} = -6vb^2, \; \delta_{23} = -\frac{2}{b^3}(10 - 2v), \; \delta_{24} = \frac{12}{b^5}, \; \delta_{31} = (2v + 7)a^2,$$

$$\delta_{32} = \delta_{42} = 1, \; \delta_{33} = \frac{2}{a^3}(1 + v), \; \delta_{34} = \frac{4}{a^5}, \; \delta_{41} = (2v + 7)b^2,$$

$$\delta_{43} = \frac{2}{b^3}(1 + v), \; \delta_{44} = \frac{4}{b^5}, \; \rho_1 = \frac{1}{3G}(Z - Y),$$

$$\rho_2 = \frac{1}{3G}(K - W), \; \rho_3 = \rho_4 = 0$$

$$\beta_{11} = \beta_{21} = -2(1 + v), \; \beta_{14} = \frac{2}{a^3}, \; \beta_{24} = \frac{2}{b^3},$$

$$\beta_{32} = \frac{1}{a^2}, \; \beta_{12} = \beta_{13} = \beta_{22} = \beta_{23} = 0, \; \beta_{31} = \beta_{41} = 2v - 1,$$

$$\beta_{33} = \frac{2}{a}(v - 1), \; \beta_{34} = \frac{2}{a^3}, \; \beta_{42} = \frac{1}{b^2}, \; \beta_{43} = \frac{2}{b}(v - 1), \; \beta_{44} = \frac{2}{b^3}$$

$$\varphi_1 = -\frac{(Z + 2Y)}{6G} - \frac{\varepsilon_0}{6} \frac{A^2}{a}(k - 1)(k + 2),$$

$$\varphi_2 = -\frac{(K + 2W)}{6G}, \; \varphi_3 = \varphi_4 = 0$$

The electric field distribution in each medium is obtained by:

$$\vec{E} = \nabla \Phi \quad (31)$$

From the above equation each component of the electric field can be obtained, and are listed as follows:

$$E_{1,r} = \left[-B\sqrt{\frac{1}{ab}} + 2C\left(\frac{ab}{r^3}\right)\right]\cos\vartheta \quad (32)$$

$$E_{1,\vartheta} = \left[B\sqrt{\frac{1}{ab}} + C\frac{ab}{r^3}\right]\sin\vartheta$$

$$E_{2,r} = \left[2D\frac{b^2}{r^3} + E_0\right]\cos\vartheta$$

$$E_{2,\vartheta} = \left[D\frac{b^2}{r^3} - E_0\right]\sin\vartheta$$

$$E_{3,r} = -\frac{A}{a}\cos\vartheta$$

$$E_{3,\vartheta} = \frac{A}{a}\sin\vartheta$$

Where $E_r$ and $E_\vartheta$ are the radial and polar component of the electric field in each medium. As done for the solid sphere the surface force acting at each interface can be written as:

$$P=[\alpha\vec{E}(\vec{E}\cdot\vec{n})]_a[\alpha\vec{E}(\vec{E}\cdot\vec{n})]_b-[\beta E^2]_a-[\beta E^2]_b \quad (33)$$

where a and b represent the media on the two sides of the interface. Using Eq. (7) and Eq. (12) the pressure distributions at the inner and outer interface are given as follows:

$$P_{1,3} = (Z-Y)\cos(\vartheta)^2 + Y$$

$$P_{1,2} = (K-W)\cos\vartheta^2 + W \quad (34)$$

Where $P_{1,3}$ is the pressure at the inner surface of the shell, while $P_{1,2}$ is the pressure on the outer surface. The constant Z, Y, K and W are defined as:

$$Z = \left(\frac{A}{a}\right)^2 \left[\left(\frac{\varepsilon_3}{\varepsilon_1}\right)^2 (\alpha_1 - \beta_1) - \alpha_3 + \beta_3\right], \quad Y = \left(\frac{A}{a}\right)^2 (\beta_3 - \beta_1) \quad (35)$$

$$K = \left(B\sqrt{\frac{1}{ab}} - 2C\frac{a}{b^2}\right)^2 \left[\left(\frac{\varepsilon_1}{\varepsilon_2}\right)^2 (\alpha_2 - \beta_2) - \alpha_1 + \beta_1\right], \quad (36)$$

$$W = \left(B\sqrt{\frac{a}{b}}\frac{1}{a} + C\frac{a}{b^2}\right)^2 (\beta_1 - \beta_2)$$

Note that these pressures are due to the inductive capacity discontinuity at the interface separating the media. If the hollow cavity is filled with a liquid (k>1), there will be an increment of the fluid pressure due to electrostriction. This change in pressure due to applied electric field is given by [18]:

$$P_3 = \frac{\varepsilon_0}{6}\frac{A^2}{a^2}(k_3-1)(k_3+2) \quad (37)$$

Figure 4:
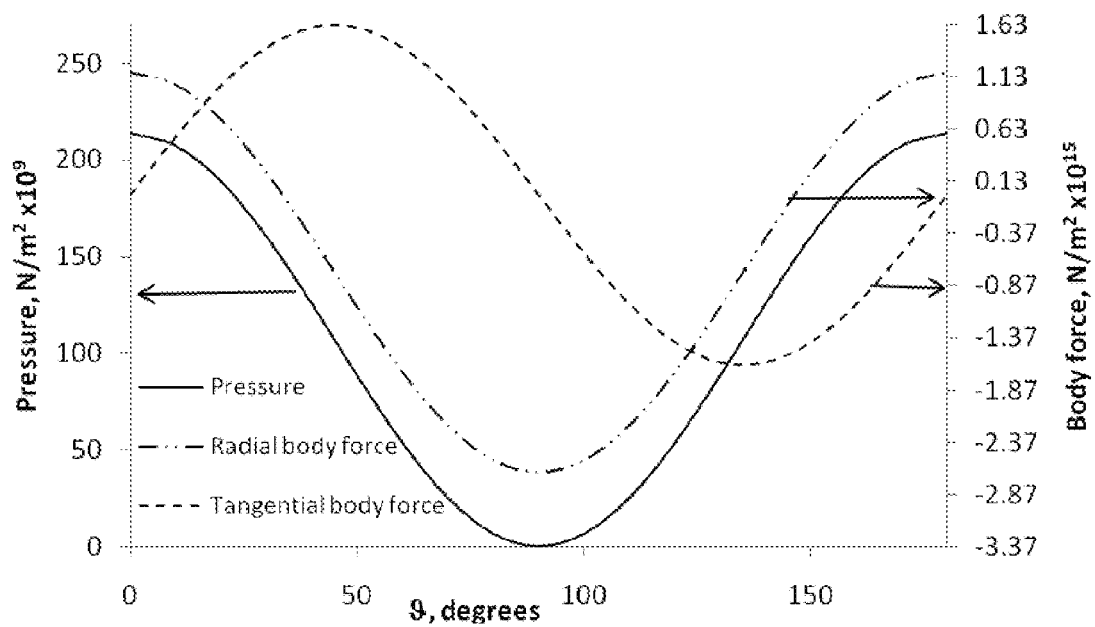
FIG. 4 is a plot showing pressure and body force distributions for a spherical PDMS shell (base-to-curing-agent ratio 60:1, a=300 μm, a/$\lambda$=288) due to applied electric field.

The effect of the body force inside the shell due to the applied electrostatic field can be calculated using Eq. (4). Considering an isotropic dielectric, the first term on the right hand side of Eq. (4) becomes zero. However, the electric field within the shell is not constant, hence, the second term on the right hand side of Eq. (4) is finite. Using the expression given by Eq. (33), the body force (per unit volume) can be determined as follows:

$$f = -\frac{1}{4}(a_1 + a_2) \left\{ \begin{bmatrix} \left(-\frac{18C^2a^2b^2}{r^7} + \frac{18BC\sqrt{ab}}{r^4}\right)\cos^2(\vartheta) - \\ \frac{6C^2a^2b^2}{r^7} - \frac{6BC\sqrt{ab}}{r^4} \end{bmatrix} \vec{r} + \sin(2\vartheta)\left(\frac{3C^2a^2b^2}{r^7} - \frac{6BC\sqrt{ab}}{r^4}\right)\vec{\vartheta} \right\} \quad (38)$$

where the constants B, and C are constants determined from Eq. (28), For a thin walled shell, the body force along the radial direction is nearly constant. In FIG. 4, the net surface pressure distribution along the polar direction ($\vartheta$) is compared to the distribution of radial and polar body force per unit volume times the shell thickness, Bt.

FIG. 4 shows that the effect of body force on hollow microspheres is several orders of magnitude smaller than the pressure force exerted on the sphere. Thus neglecting the body force in the analysis. The components of the displacement in the radial direction is given by [22]:

$$u_r = \sum [A_n(n+1)(n-2+4v)R^{n+1} + B_n nR^{n-1}]P_n(\cos\vartheta) + \quad (39)$$

-continued $$\left[\frac{C_n}{R^n}(n^2+3n-2v) + \frac{D_n(n+1)(n+2)}{R^{n+2}}\right]P_n(\cos\vartheta)$$

whereas the corresponding stress components are:

$$\sigma_{rr} = \quad (40)$$
$$2G\sum [A_n(n+1)(n^2-n-2-2v)R^n + B_n n(n-1)R^{n-2}]P_n(\cos\vartheta) +$$
$$\left[-\frac{C_n n}{R^{n+1}}(n^2+3n-2v) + \frac{D_n(n+1)(n+2)}{R^{n+3}}\right]P_n(\cos\vartheta)$$

$$\sigma_{\vartheta\vartheta} = 2G\sum \left[A_n(n^2+4n+2+2v)(n+1)r^n + \right. \quad (41)$$
$$B_n n^2 r^{n-2} + \frac{C_n n}{r^{n+1}}(n^2-2n-1+2v) - \frac{D_n(n+1)^2}{r^{n+3}}\right]$$
$$P_n(\cos\vartheta)\left[A_n(n+5-4v)r^n + B_n r^{n-2} - \right.$$
$$\left.\frac{C_n}{r^{n+1}}(-n+4-4v) + \frac{D_n}{r^{n+3}}\right]\cot\vartheta \frac{dP_n(\cos\vartheta)}{d\vartheta}$$

$$\sigma_{\varphi\varphi} = 2G\sum \left[A_n(n+1)(n-2-2v-4nv)r^n + B_n n r^{n-2} + \right. \quad (42)$$
$$\frac{C_n n}{r^{n+1}}(n+3-4nv-2v) - \frac{D_n(n+1)}{r^{n+3}}\right]P_n(\cos\vartheta) +$$
$$\left[A_n(n+5-4v)r^n + B_n r^{n-2} + \frac{C_n}{r^{n+1}}(-n+4-4v) + \frac{D_n}{r^{n+3}}\right]$$
$$\cot\vartheta \frac{dP_n(\cos\vartheta)}{d\vartheta}$$

$$\sigma_{\varphi\varphi} = 2G\sum \left[A_n(n+1)(n-2-2v-4nv)r^n + B_n n r^{n-2} + \right. \quad (43)$$
$$\frac{C_n n}{r^{n+1}}(n+3-4nv-2v) - \frac{D_n(n+1)}{r^{n+3}}\right]P_n(\cos\vartheta) +$$
$$\left[A_n(n+5-4v)r^n + B_n r^{n-2} + \frac{C_n}{r^{n+1}}(-n+4-4v) + \frac{D_n}{r^{n+3}}\right]$$
$$\cot\vartheta \frac{dP_n(\cos\vartheta)}{d\vartheta}$$

The constants $A_n$, $B_n$, $C_n$ and $D_n$ are determined by satisfying the boundary conditions. The boundary conditions are defined as follow:

$$\sigma_{rr}(a) = -P_3 - P_{1,3} \quad \sigma_{rr}(b) = P_{1,2}$$

$$\sigma_{r\vartheta}(a) = 0 \quad \sigma_{r\vartheta}(b) = 0 \quad (44)$$

The pressure acting at the boundaries of the hollow sphere can be expanded into Fourier-Legendre series as:

$$P_{1,3} = \Sigma E_n P_n(\cos\vartheta) = (Z-Y)\cos(\vartheta)^2 + Y$$

$$P_{1,2} = \Sigma F_n P_n(\cos\vartheta) = (K-W)\cos(\vartheta)^2 + W \quad (45)$$

Again, only two terms of the series are needed to represent the pressure on the inner and outer surfaces of the hollow sphere. These are:

$$E_0 = \frac{1}{3}(Z+2Y) \quad F_0 = \frac{1}{3}(K+2W) \quad (46)$$

$$E_2 = \frac{2}{3}(Z-Y) \quad F_2 = \frac{2}{3}(K-W)$$

Substituting Eq. (46) into Eq. (45) and then into Eq. (44) the constants of Eq. (39) can be obtained. They are determined by solving the following two linear systems:

$$\begin{pmatrix} \beta_{11} & \beta_{12} & \beta_{13} & \beta_{14} \\ \beta_{21} & \beta_{22} & \beta_{23} & \beta_{24} \\ \beta_{31} & \beta_{32} & \beta_{33} & \beta_{34} \\ \beta_{41} & \beta_{42} & \beta_{43} & \beta_{44} \end{pmatrix} \cdot \begin{pmatrix} A_0 \\ B_0 \\ C_0 \\ D_0 \end{pmatrix} = \begin{pmatrix} \varphi_1 \\ \varphi_2 \\ \varphi_3 \\ \varphi_4 \end{pmatrix} \quad (47)$$

$$\begin{pmatrix} \delta_{11} & \delta_{12} & \delta_{13} & \delta_{14} \\ \delta_{21} & \delta_{22} & \delta_{23} & \delta_{24} \\ \delta_{31} & \delta_{32} & \delta_{33} & \delta_{34} \\ \delta_{41} & \delta_{42} & \delta_{43} & \delta_{44} \end{pmatrix} \cdot \begin{pmatrix} A_2 \\ B_2 \\ C_2 \\ D_2 \end{pmatrix} = \begin{pmatrix} \rho_1 \\ \rho_2 \\ \rho_3 \\ \rho_4 \end{pmatrix}$$

The matrix coefficients $\beta_{ij}$, $\phi_i$, $\delta_{ij}$, $\rho_{ij}$ are presented in Appendix A. Once the constants $A_n$, $B_n$, $C_n$ and $D_n$ are known, the change in WGM due to strain (da/a) can be calculated by using Eq. (39). However, as discussed earlier, $dn_0/n_0 \ll da/a$, thus this effect on WGM shifts is neglected.

Figure 5:
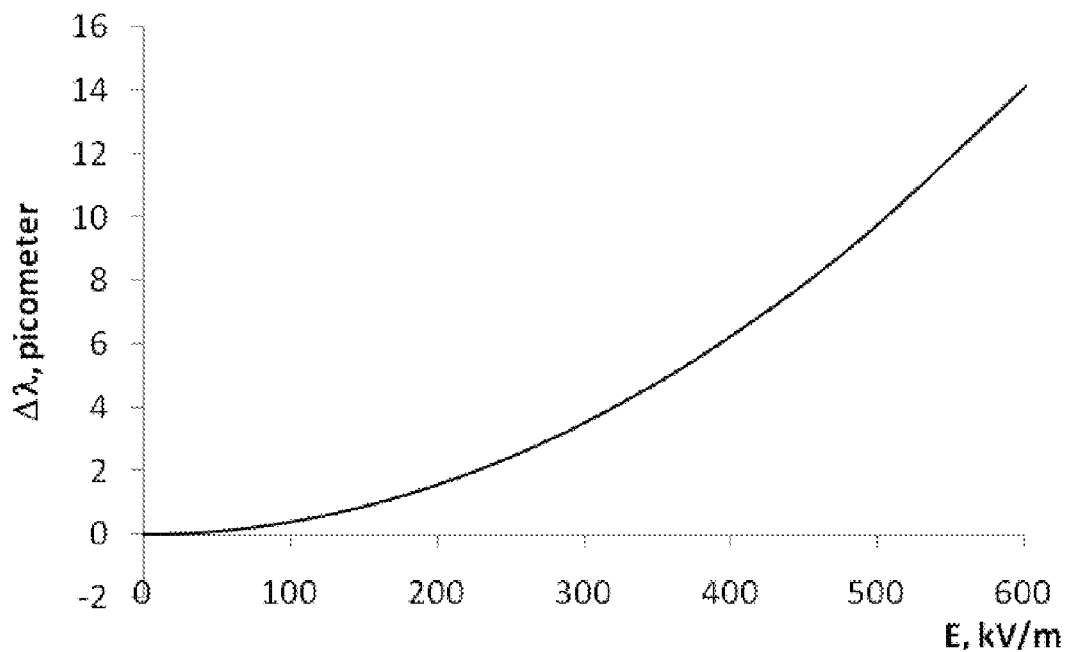
FIG. 5 is a plot showing the WGM shifts of a hollow PDMS (60:1) sphere with the applied electric field due to strain effects (a/b=0.95, b/$\lambda$=381)

The WGM shifts at the equatorial belt ($\vartheta = \pi/2$, r=b) of a hollow PDMS microsphere of 600 μm diameter and b/a=0.95 are shown in FIG. 5. In this configuration, the PDMS shell is filled with and also surrounded by air (Note here that the stress effect is several orders of magnitude smaller than that of strain and hence, does not play a role in WGM shift). Comparing FIG. 5 to FIG. 2, it is seen that the effect of electric field on shape distortion of the spheres are opposite: The solid sphere becomes elongated in the direction of the static field. On the other hand, the hollow sphere elongates in the direction normal to the applied field.

Figure 6:
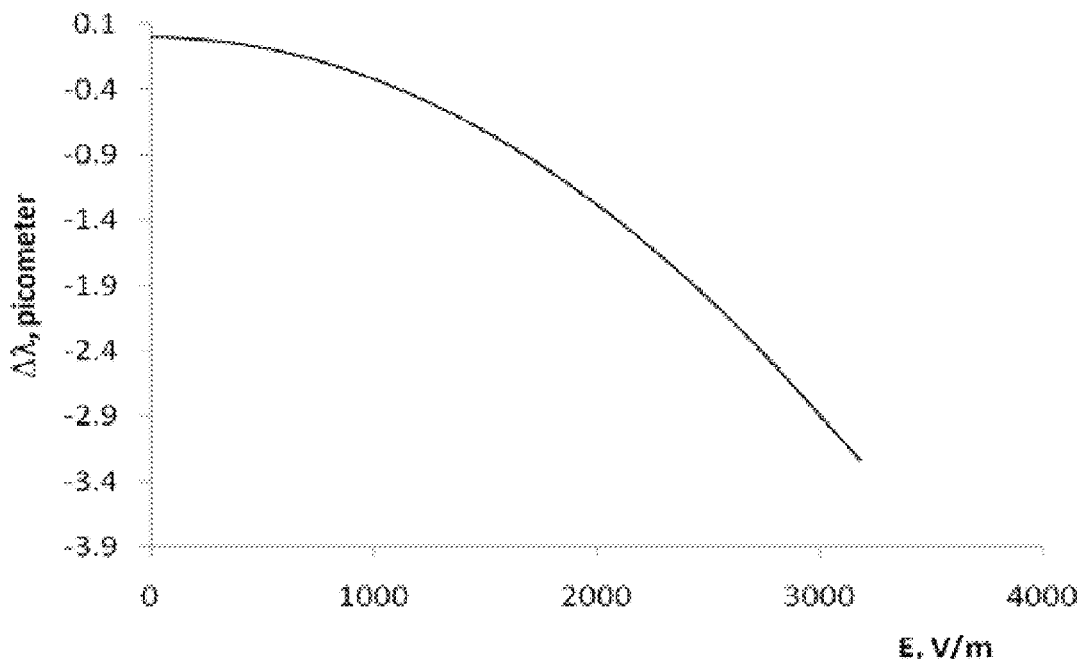
FIG. 6 is a plot showing the WGM shifts of a hollow PDMS (60:1) sphere filled with water (a/b=0.95, b/$\lambda$=381)

The inventors studied the case where the fluid inside the sphere has a higher inductive capacity than that of the surrounding medium ($\in_3 > \in_2$). For this, we consider the case of a thin spherical shell of PDMS that is filled with water (k=80.1) and surrounded by air on the outside. FIG. 6 illustrates the solution for this particular configuration. A comparison of FIG. 6 and FIG. 5 reveals that, filling the sphere with water increases the sensitivity significantly.

Figure 7:
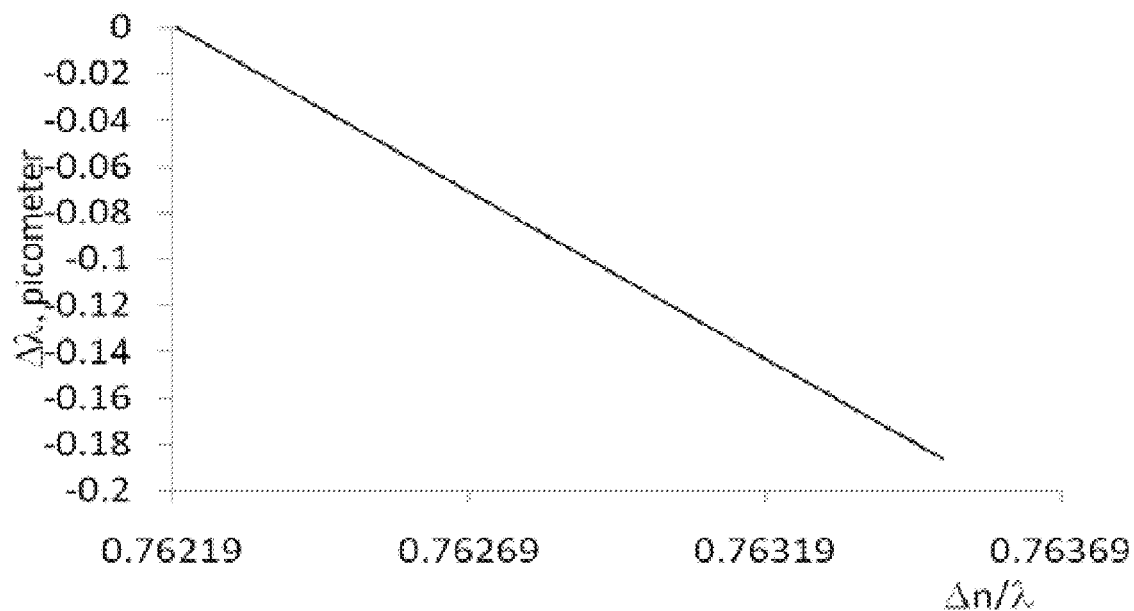
FIG. 7 is a plot showing the WGM shifts of a hollow PDMS (60:1) sphere filled with water (a/b=0.95, b/$\lambda$=381) under constant electric field of 10 kV/m. The WGM shifts obtained here are due to the change of refractive index of the surrounding medium.

With a Q-factor of $10^7$, the resolution of the sensor is estimated to be ~500 V/m. The inventors address whether such a sensor can be used to detect contaminants in surrounding medium. FIG. 7 illustrates this. Using the same configuration as before (spherical PDMS shell filled with water inside and surrounded by air), the electric field applied on the sphere is kept at 10 k V/m and the refractive index of the outside medium is changed. The resulting WGM shift is given in FIG. 7. Again, with Q-factor of ~$10^7$, the sensor can detect changes in the refractive index of ~$10^{-4}$ in a gas (at the wavelength $\lambda$=1.312 μm). FIG. 7, when compared with the analysis [10], indicates a resolution improvement of at least an order of magnitude when the electric field is applied to the micro-sphere. These results show that a sensor could be developed for the detection of contaminants both in air and in liquids.

Figure 8:
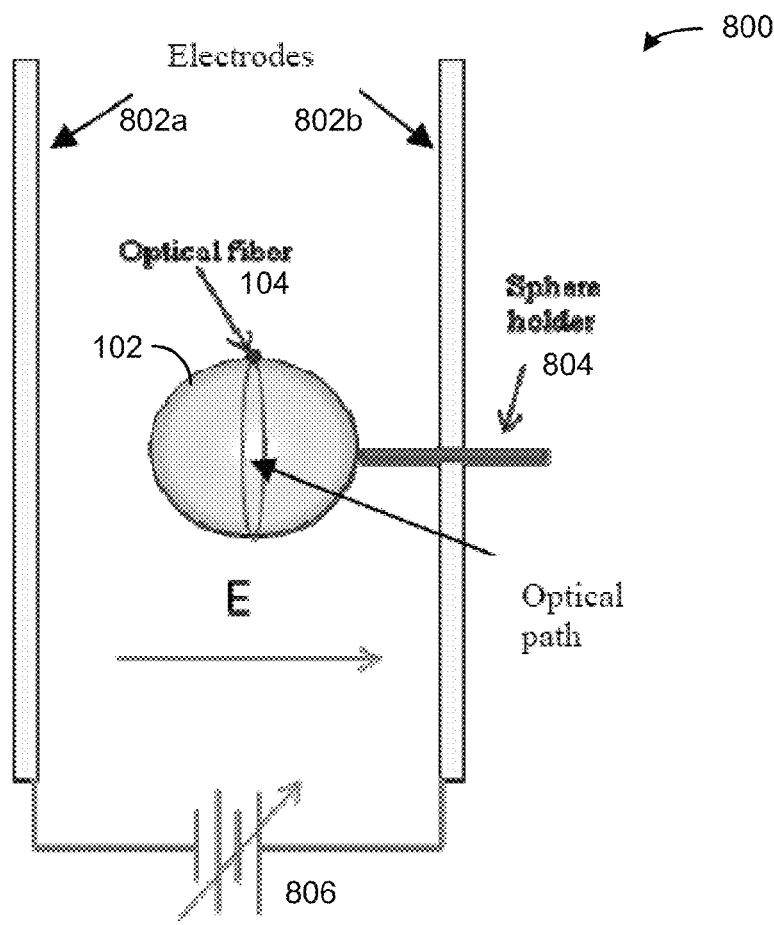
FIG. 8 is a schematic of the set-up for the electrostriction studies.

FIG. 8 is a schematic diagram an apparatus 800 in accordance with the present invention used for experimentation. Electrostriction studies were carried out using a solid PDMS microsphere 102 (with base to curing agent ratio of 60:1). The diameter of the microspheres 102 was ~900 μm and it was manufactured using the same procedure as in earlier studies by the present inventors [12]. The optical setup is similar to those reported in [11,12]. Briefly, the output of a distributed feedback (DFB) laser diode (with a nominal wavelength of ~1312 nm, not shown in the figure) is coupled into a single mode optical fiber 104. A section of the fiber 104 is heated and stretched to facilitate optical coupling between the microsphere 102 and the optical fiber 104. Stable coupling is achieved by bringing the tapered fiber 104 in contact with the microsphere 102. The DFB laser is current-tuned over a range of ~0.1 nm using a laser controller (not shown) while its temperature kept constant. The laser controller, in turn, is driven by a function generator (not shown) which provides a saw tooth input to the controller. The quality factor of the WGMs were observed to be Q~$10^6$ during these studies.

The PDMS microsphere 102 was placed in between two square electrodes 802a and 802b made of brass. The side and thickness of the electrodes 802a and 802b are 25 mm and 0.25 mm, respectively. The gap between the two electrodes 802a and 802b is 4.5 mm. The microsphere 102 is held in place by a 125 μm diameter silica stem 804 (that is fixed to the PDMS sphere 102 during the curing process). The electrodes 103a and 103b are connected to a DC voltage supply 806. As the voltage is gradually increased the, WGM shifts are recorded and analyzed on a personal computer.

Figure 9:
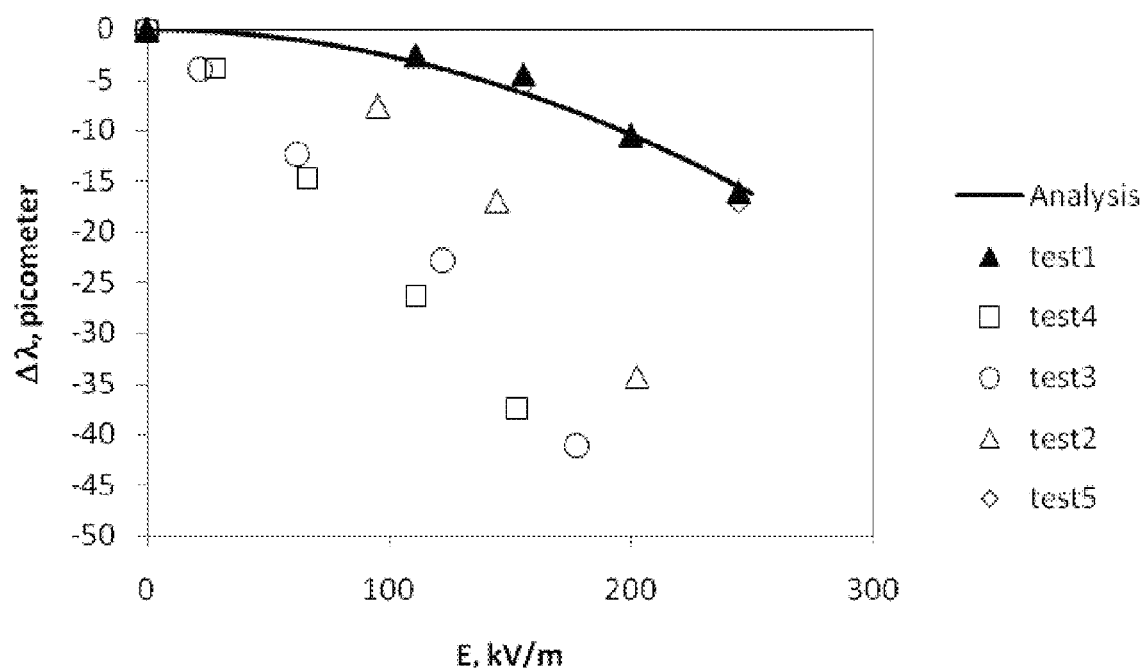
FIG. 9 shows the experimental and analytical results for a solid PDMS (60:1) microsphere.

The results are shown in FIG. 9 along with the analytical expression of Eq. (24). As shown in the figure, the same study is repeated multiples times over a period of several hours. There is good agreement between the experimentally obtained WGM shifts of test 1 and those predicted by Eq. (24). Test 1 was carried out without first exposing the PDMS microsphere to an electric field for an extended period. The additional measurements were made after keeping the sphere exposed to a 200 kV/m electric field over progressively longer periods of time (two minutes, two hours and four hours for tests 2, 3 and 4, respectively).

These results show that the WGM shift dependence on the electric field becomes stronger after exposing the sphere to electric field. This effect is most likely due to the alignment of some of the dipoles in PDMS along the electric field. Such polarization behavior has been observed earlier in polymers [23]. With increased time, a larger number of dipoles are aligned with the electric field resulting in increased polarization of the microsphere. This in turn, leads to higher electrostatic pressure at the sphere surface and hence, increased WGM shift. Test 5 in FIG. 9 was carried out after the sphere was allowed to relax for 24 hours. Clearly, after this relaxation period, the polarization goes back to its initial level and the original WGM shift dependence on the electric field is recovered.

Electrostriction effect on the whispering gallery modes of polymeric microspheres was investigated analytically and validated. The analysis shows that the external electric field strength can be measured by monitoring the WGM shifts. Hollow PDMS spheres that are filled with air are less sensitive than their solid counterparts. However when a hollow PDMS sphere is filled with a dielectric liquid, the sensitivity of its WGMs to electric field increases significantly. An analysis was also carried out to determine the WGM shift dependence on dielectric constant perturbations of the surrounding medium (with the dielectric shell subjected to constant electric field). The results indicate that a WGM-based sensor may be feasible for impurity detection in gases or liquids. Electrostatic field tuning of micro-resonator WGMs may also be exploited for fast, narrowband optical switches and filters.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

U.S. Pat. No. 6,922,059: Electric field sensor.
United States Patent Application No. 20080238433: Sensor Product for Electric Field Sensing.
United States Patent Application No 20090091329: Electric field sensor for marine environments.

1. W. von, Klitzing, "Tunable whispering modes for spectroscopy and CQED Experiments," New J. Phys., 3, 14.1-14.14 (2001).
2. M. Cai, O. Painter, and K. J. Vahala, "Fiber-coupled microsphere laser," Opt. Lett., 25, 1430-1432 (2000).
3. H. C. Tapalian, J. P. Laine, and P. A. Lane, "Thermooptical switches using coated microsphere resonators," IEEE Photon. Technol. Lett., 14, 8, 1118-1120 (2002).
4. B. E. Little, S. T. Chu, H. A. Haus, "Microring resonator channel dropping filters," J. of Lightwave Technol., 15, 998-1000 (1997).
5. B. J. Offrein, R. Germann, F. Horst, H. W. M. Salemink, R. Beyerl, G. L. Bona, "Resonant coupler-based tunable add-after-drop filter in silicon-oxynitride technology for WDM networks," IEEE J. Sel. Top. Quantum Electron., 5, 1400-1406, (1999).
6. V. S. Ilchenko, P. S. Volikov, V. L. Velichansky, F. Treussart, V. Lefevre-Seguin, J.-M. Raimond, and S. Haroche, "Strain tunable high-Q optical microsphere resonator," Opt. Commun., 145, 86-90 (1998).
7. F. Vollmer, D. Brown, A. Libchaber, M. Khoshsima, I. Teraoka, and S. Arnold, "Protein detection by optical shift of a resonant microcavity," Appl. Phys. Lett., 80, 4057-4059 (2002).
8. S. Arnold, M. Khoshsima, I, Teraoka, S. Holler, F. Vollmer, "Shift of whispering gallery modes in microspheres by protein adsorption," Opt. Lett., 28, 4, 272-274 (2003).
9. A. T. Rosenberger and J. P. Rezac, "Whispering-gallery-mode evanescent-wave microsensor for trace-gas detection," Proc. SPIE, 4265, 102-112 (2001).
10. N. Das, T. Ioppolo, and V. Ötügen, "Investigation of a micro-optical concentration sensor concept based on whispering gallery mode resonators," presented at the 45th AIAA Aerospace Sciences Meeting and Exhibition, Reno, Nev., Jan. 8-11 2007.
11. T. Ioppolo, M. Kozhevnikov, V. Stepaniuk, M. V. Ötügen and V. Sheverev, "Micro-optical force sensor concept based on whispering gallery mode resonances," Appl. Opt., 47, 16, 3009-3014 (2008).
12. T. Ioppolo, U. K. Ayaz, and M. V. Ötügen, "High-resolution force sensor based on morphology dependent optical resonances of polymeric spheres," J. Appl. Phys., 105, 013535.1-013535.9 (2009).
13. T. Ioppolo and M. V. Ötügen, "Pressure Tuning of Whispering Gallery Mode Resonators," 2007, J. Opt. Soc. Am. B, 24, 10, 2721-2726 (2007).
14. G. Guan, S. Arnold and M. V. Ötügen, "Temperature Measurements Using a Micro-Optical Sensor Based on Whispering Gallery Modes," AIAA Journal, 44, 2385-2389 (2006).
15. T. Ioppolo, U. K. Ayaz, M. V. Ötügen, V. Sheverev, "A Micro-Optical Wall Shear Stress Sensor Concept Based on Whispering Gallery Mode Resonators," 46th AIAA Aerospace Sciences Meeting and Exhibit, 8-11 Jan. 2008.
16. V. M. N. Passaro, F. D. Leaonardis, "Modeling and Design of a Novel High-Sensitivity Electric Field Silicon-on-Insulator Sensor Based on a Whispering-Gallery-Mode Resonator," IEEE J. Sel. Top. Quantum Electron., 12, 1, 124-133 (2006).
17. R. W. Soutas-Little, Elasticity, (Dover Publications Inc., Mineola, N.Y., 1999).
18. J. A. Stratton, Electromagnetic Theory (Mcgraw-Hill Book Company, Inc., New York and London, 1941).
19. F. Ay, A. Kocabas, C. Kocabas, A. Aydinli, and S. Agan "Prism coupling technique investigation of elasto-optical properties of thin polymer films," J. Appl. Phys., 96, 341-345 (2004).

20. J. E. Mark, Polymer Data Handbook (Oxford University Press, 1999).
21. T. Yamwong, A. M. Voice and G. R. Davies, "Electrostrictive response of an ideal polar rubber," J. Appl. Phys., 91, 3, 1472-1476 (2002).
22. A. E. H. Love, The Mathematical Theory of Elasticity (Dover, 1926).
23. K. C. Kao, Dielectric Phenomena in Solids (Elsevier Academic Press, 2004).

What is claimed is:

1. A micro-optical sensor device to detect an electric field comprising:
   a sensing element comprising a dielectric micro-cavity; and
   an optical fiber having an optical input, an optical output and a section having an exposed or partially exposed core disposed between the optical input and the optical output, wherein at least a portion of the section is optically coupled to the dielectric micro-cavity along a circumference of the dielectric micro-cavity such that a change in an refractive index or a radius of the dielectric micro-cavity as a result of electrostriction caused by the electric field creates a shift in an optical resonance (whispering gallery mode) that is detected at the optical output.

2. The device of claim 1, wherein:
   the dielectric micro-cavity is filled with one or more dielectric polymeric materials, or a dielectric liquid; or
   the dielectric micro-cavity comprises a solid sphere, a hollow sphere, a cylinder, a disk, or any other suitable geometric shape.

3. The device of claim 2, wherein the dielectric polymeric materials are selected from the group consisting of polydimethylsiloxane (PDMA), poly (methyl methacrylate) (PMMA), polyimide, polyvinylidene fluoride, ethylene trifluoride and ethylene chloride trifluoride.

4. The device of claim 1, further comprising:
   a laser light source connected to the optical input of the optical fiber; and
   a photodiode connected to the optical output of the optical fiber.

5. The device of claim 1, wherein the shift in the optical resonance is according to Equation (I):

$$\frac{\Delta R}{R} + \frac{\Delta n}{n_0} = \frac{\Delta \lambda}{\lambda} = \frac{\Delta v}{v} \qquad (I)$$

wherein, $\Delta R$=perturbation in the radius of the dielectric micro-cavity, R=the radius of the dielectric micro-cavity, $\Delta n$=perturbation in the refractive index of the dielectric micro-cavity, $n_0$=the refractive index of the dielectric micro-cavity, $\Delta \lambda$=perturbation in a vacuum wavelength of the laser light, $\lambda$=vacuum wavelength of the laser light, $\Delta v$=perturbation in the frequency of the laser light, and v=frequency of the laser light.

6. The device of claim 1, wherein the dielectric micro-cavity is a micro-sphere having a diameter in a range of about 100 µm to 5 mm.

7. The device of claim 1, wherein the device has a large optical quality factor (Q)>$10^5$.

8. The device of claim 1, wherein a radius (R) of the dielectric micro-cavity is greater than a vacuum wavelength ($\lambda$) of a laser light from the laser light source, wherein $\lambda$<<R.

9. The device of claim 1, wherein the micro-optical sensor device has a resolution in a range of about 5 V/m to 700 V/m.

10. The device of claim 1, wherein the device is used as an electrostatic field-driven optical switch or filter.

11. A method of detecting and measuring a magnitude of an electric field using a dielectric micro-cavity sensor device comprising the steps of:
    placing the dielectric micro-cavity sensor device in a medium having a lower refractive index, wherein the micro-optical sensor device comprises one or more dielectric micro-cavities and an optical fiber having an optical input, an optical output and a section having an exposed or partially exposed core disposed between the optical input and the optical output, wherein at least a portion of the section is optically coupled to the dielectric micro-cavity along a circumference of the dielectric micro-cavities such that a change in an refractive index or a radius of the dielectric micro-cavities as a result of electrostriction caused by the electric field creates a shift in an optical resonance (whispering gallery mode);
    providing a light from a laser light source to the optical input of the optical fiber;
    detecting any shift in the optical resonance of the dielectric micro-cavities using a photodiode connected to the optical output of the optical fiber; and
    determining a magnitude of the electric field from the detected shift in the optical resonance of the dielectric micro-cavities.

12. The method of claim 11, wherein:
    the medium comprises air, water, or a gas;
    the dielectric micro-cavity is filled with one or more dielectric polymeric materials, or a liquid having a large dielectric constant, wherein the liquids comprise water, water containing one or more electrolytes, an electrolytic solution or any combinations thereof; or
    the dielectric micro-cavity comprises a solid sphere, a hollow sphere, a cylinder, a disk, or any other suitable geometric shape.

13. The method of claim 12, wherein the dielectric polymeric materials are selected from the group consisting of polydimethylsiloxane (PDMA), poly (methyl methacrylate) (PMMA), polyimide, polyvinylidene fluoride, ethylene trifluoride and ethylene chloride trifluoride.

14. The method of claim 12, wherein the one or more dielectric polymeric materials are cured in an electric field.

15. The method of claim 11, wherein the shift in the optical resonance is according to Equation (I):

$$\frac{\Delta R}{R} + \frac{\Delta n}{n_0} = \frac{\Delta \lambda}{\lambda} = \frac{\Delta v}{v} \qquad (I)$$

wherein, $\Delta R$=perturbation in the radius of the dielectric micro-cavity, R=the radius of the dielectric micro-cavity, $\Delta n$=perturbation in the refractive index of the dielectric micro-cavity, $n_0$=the refractive index of the dielectric micro-cavity, $\Delta \lambda$=perturbation in a vacuum wavelength of the laser light, $\lambda$=vacuum wavelength of the laser light, $\Delta v$=perturbation in the frequency of the laser light, and v=frequency of the laser light.

16. The method of claim 11, wherein the optical micro-cavity is a hollow PDMS sphere filled with water, wherein the micro-sphere is placed in air.

17. The method of claim 11, wherein one or more conductive materials are embedded on or inside the micro-cavities, wherein the one or more conductive materials comprise ferromaterials, electrically conducting materials or any combinations thereof.

18. A micro-optical sensor device to detect one or more impurities or contaminants in a liquid or gas comprising;
a sensing element comprising a dielectric micro-cavity; and
an optical fiber having an optical input, an optical output and a section having an exposed or partially exposed core disposed between the optical input and the optical output, wherein at least a portion of the section is optically coupled to the dielectric micro-cavity along a circumference of the dielectric micro-cavity such that a change in an refractive index of the liquid or gas due to a presence of one or more impurities or contaminants creates a shift in an optical resonance (whispering gallery mode) that is detected at the optical output when the dielectric micro-cavity is located in the liquid or gas.

19. The device of claim 18, wherein:
the dielectric micro-cavity is filled with one or more dielectric polymeric materials, or a dielectric liquid; or
the dielectric micro-cavity comprises a solid sphere, a hollow sphere, a cylinder, a disk, or any other suitable geometric shape.

20. The device of claim 19, wherein the dielectric polymeric materials are selected from the group consisting of polydimethylsiloxane (PDMA), poly (methyl methacrylate) (PMMA), polyimide, polyvinylidene fluoride, ethylene trifluoride and ethylene chloride trifluoride.

21. The device of claim 18, further comprising:
a laser light source connected to the optical input of the optical fiber; and
a photodiode connected to the optical output of the optical fiber.

22. The device of claim 18, wherein the shift in the optical resonance is according to Equation (I):

$$\frac{\Delta R}{R} + \frac{\Delta n}{n_0} = \frac{\Delta \lambda}{\lambda} = \frac{\Delta v}{v} \qquad (I)$$

wherein, $\Delta R$=perturbation in the radius of the dielectric micro-cavity, R=the radius of the dielectric micro-cavity, $\Delta n$=perturbation in the refractive index of the dielectric micro-cavity, $n_0$=the refractive index of the dielectric micro-cavity, $\Delta\lambda$=perturbation in a vacuum wavelength of the laser light, $\lambda$=vacuum wavelength of the laser light, $\Delta v$=perturbation in the frequency of the laser light, and v=frequency of the laser light.

23. The device of claim 18, wherein the dielectric micro-cavity is a micro-sphere having a diameter in a range of about 100 μm to 5 mm.

24. The device of claim 18, wherein the device has a large optical quality factor (Q)>$10^5$.

25. The device of claim 18, wherein a radius (R) of the dielectric micro-cavity is greater than a vacuum wavelength ($\lambda$) of a laser light from the laser light source, wherein $\lambda \ll R$.

26. The device of claim 18, wherein the micro-optical sensor device has a resolution in a range of about 5 V/m to 700 V/m.

27. A method of detecting one or more impurities or contaminants in a medium using a dielectric micro-cavity sensor device comprising the steps of:
placing the dielectric micro-cavity sensor device in the medium, wherein the micro-optical sensor device comprises one or more dielectric micro-cavities and an optical fiber having an optical input, an optical output and a section having an exposed or partially exposed core disposed between the optical input and the optical output, wherein at least a portion of the section is optically coupled to the dielectric micro-cavity along a circumference of the dielectric micro-cavities such that a change in an refractive index of the medium caused by the one or more impurities or contaminants creates a shift in an optical resonance (whispering gallery mode);
providing a light from a laser light source to the optical input of the optical fiber; and
detecting the one or more impurities or contaminants by detecting the shift in the optical resonance of the dielectric micro-cavities using a photodiode connected to the optical output of the optical fiber.

28. The method of claim 27, wherein:
the medium comprises air, water, or a gas;
the dielectric micro-cavity is filled with one or more dielectric polymeric materials, or a liquid having a large dielectric constant, wherein the liquids comprise water, water containing one or more electrolytes, an electrolytic solution or any combinations thereof; or
the dielectric micro-cavity comprises a solid sphere, a hollow sphere, a cylinder, a disk, or any other suitable geometric shape.

29. The method of claim 28, wherein the dielectric polymeric materials are selected from the group consisting of polydimethylsiloxane (PDMA), poly (methyl methacrylate) (PMMA), polyimide, polyvinylidene fluoride, ethylene trifluoride and ethylene chloride trifluoride.

30. The method of claim 28, wherein the one or more dielectric polymeric materials are cured in an electric field.

31. The method of claim 27, wherein the shift in the optical resonance is according to Equation (I):

$$\frac{\Delta R}{R} + \frac{\Delta n}{n_0} = \frac{\Delta \lambda}{\lambda} = \frac{\Delta v}{v} \qquad (I)$$

wherein, $\Delta R$=perturbation in the radius of the dielectric micro-cavity, R=the radius of the dielectric micro-cavity, $\Delta n$=perturbation in the refractive index of the dielectric micro-cavity, $n_0$=the refractive index of the dielectric micro-cavity, $\Delta\lambda$=perturbation in a vacuum wavelength of the laser light, $\lambda$=vacuum wavelength of the laser light, $\Delta v$=perturbation in the frequency of the laser light, and v=frequency of the laser light.

32. The method of claim 27, wherein the optical micro-cavity is a hollow PDMS sphere filled with water, wherein the micro-sphere is placed in air.

33. The method of claim 27, wherein one or more conductive materials are embedded on or inside the micro-cavities, wherein the one or more conductive materials comprise ferromaterials, electrically conducting materials or any combinations thereof.

* * * * *

UNITED STATES PATENT AND TRADEMARK OFFICE
CERTIFICATE OF CORRECTION

PATENT NO. : 8,718,416 B2  
APPLICATION NO. : 12/939168  
DATED : May 6, 2014  
INVENTOR(S) : Tindaro Ioppolo, Volkan Otugen and Ulas Ayaz Page 1 of 1

It is certified that error appears in the above-identified patent and that said Letters Patent is hereby corrected as shown below:

In the Specification

Column 1, Lines 8-9, "Nos. CBET-0809240 and DE-FG02-08ER85099" should read
--No. CBET-0809240--.

Signed and Sealed this
Seventeenth Day of February, 2015

Michelle K. Lee
*Deputy Director of the United States Patent and Trademark Office*